(12) United States Patent
Zhao et al.

(10) Patent No.: US 11,594,442 B2
(45) Date of Patent: Feb. 28, 2023

(54) TRANSFER SUBSTRATE, DISPLAY PANEL AND TRANSFER METHOD

(71) Applicant: Shanghai Tianma Micro-Electronics Co., Ltd., Shanghai (CN)

(72) Inventors: Jian Zhao, Shanghai (CN); Xiaohe Li, Shanghai (CN); Haoxu Hu, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 169 days.

(21) Appl. No.: 17/037,139

(22) Filed: Sep. 29, 2020

(65) Prior Publication Data

US 2021/0013083 A1 Jan. 14, 2021

(30) Foreign Application Priority Data

Jun. 30, 2020 (CN) .......................... 202010622522.0

(51) Int. Cl.
 *H01L 21/683* (2006.01)
 *G09G 3/32* (2016.01)
 *H01L 25/16* (2006.01)

(52) U.S. Cl.
 CPC .......... *H01L 21/6835* (2013.01); *G09G 3/32* (2013.01); *H01L 25/167* (2013.01); *G09G 2300/0404* (2013.01)

(58) Field of Classification Search
 CPC ..... H01L 21/6835; H01L 24/00; H01L 24/80; H01L 24/97; H01L 33/645; H01L 2924/12041; H01L 2924/00012; H01L 25/167; H01L 2224/80097; H01L 2224/95136; G09G 3/32; G09G 2300/0404
 See application file for complete search history.

(56) References Cited

U.S. PATENT DOCUMENTS

2018/0240932 A1* 8/2018 Chen ................... H01L 33/08
2020/0058533 A1* 2/2020 Zou .................... H01L 27/156
2020/0203558 A1* 6/2020 Chen .................... H01L 24/95

FOREIGN PATENT DOCUMENTS

| CN | 106903978 A | 6/2017 |
| CN | 109727901 A | 5/2019 |
| CN | 109950182 A | 6/2019 |

\* cited by examiner

*Primary Examiner* — Priyank J Shah
(74) *Attorney, Agent, or Firm* — von Briesen & Rope, s.c.

(57) ABSTRACT

Provided are a transfer substrate, a display panel and a transfer method. The transfer substrate includes a plurality of object setting regions arranged in an array, the plurality of object setting regions including n types, where n is a positive integer, and n≥2. The transfer substrate further includes: a base substrate, and a blocking layer located on a side of the base substrate. The blocking layer forms accommodating grooves respectively within object setting regions. Phase change materials are provided in accommodating grooves of at least (n−1) types of object setting regions. The provided transfer substrate has a simple structure and high transfer efficiency.

16 Claims, 18 Drawing Sheets

TRANSFER SUBSTRATE, DISPLAY PANEL AND TRANSFER METHOD

CROSS-REFERENCE TO RELATED APPLICATION

This application claims priority to Chinese Patent Application No. 202010622522.0 filed Jun. 30, 2020, the disclosure of which is incorporated herein by reference in its entirety.

TECHNICAL FIELD

The present disclosure relates to the technical field of display technologies and, in particular, to a transfer substrate, a display panel and a transfer method.

BACKGROUND

If the massive transfer of different types of objects is desired to be achieved, the method of one-by-one transfer is generally adopted in the existing art. Exemplarily, for the massive transfer of Micro Light-Emitting Diodes (Micro LEDs) in a Micro LED display panel in the field of display technologies in the existing art, a transfer head is made for LED chip particles to be transferred from a native substrate to a substrate having a driving circuit. The transfer technology in the existing art is complex in process, low in efficiency and high in cost.

SUMMARY

In view of the above matter, a transfer substrate, a display panel and a transfer method are provided in the present disclosure. The structures are simple and the transfer efficiency is high.

In a first aspect, a transfer substrate is provided in the present disclosure and includes a plurality of object setting regions which are arranged in an array and configured to place objects to be placed. The plurality of object setting regions include n types, where n is a positive integer, and n≥2.

The transfer substrate further includes: a base substrate, and a blocking layer located on a side of the base substrate, where the blocking layer forms accommodating grooves respectively within the plurality of object setting regions.

Phase change materials are provided in accommodating grooves of at least (n−1) types of object setting regions.

In a second aspect, a display panel is further provided in the present disclosure and includes an array substrate, a pixel driving circuit array and an insulating layer. The array substrate includes a base substrate. The base substrate includes a plurality of sub-pixel setting regions arranged in an array.

The pixel driving circuit array is located on a side of the base substrate.

The insulating layer is located on a side of the pixel driving circuit array facing away from the base substrate. The pixel driving circuit array includes pixel driving circuits arranged in an array. The insulating layer forms accommodating grooves respectively within of the plurality of sub-pixel setting regions. The pixel driving circuits are disposed in one-to-one correspondence with accommodating grooves.

The display panel further includes data lines and heating lines, where each of the data lines is electrically connected to a respective column of pixel driving circuits among a plurality of columns of pixel driving circuits arranged in the array.

The data lines are multiplexed as the heating line; in a preparation stage, the data lines serve as the heating line to enable light-emitting elements to be transferred to the accommodating grooves; in a display stage, the data lines are configured to provide signals for the pixel driving circuits so that the pixel driving circuits are able to generate currents for driving the light-emitting elements to emit light.

Alternatively, the heating line and the data lines are disposed at a same layer.

In a phase change stage, the heating line enables light-emitting elements to be transferred to the accommodating grooves.

In a data writing phase, the data lines are configured to provide signals for the pixel driving circuits so that the pixel driving circuits are able to generate currents for driving the light-emitting elements to emit light.

In a third aspect, a transfer method is further provided in the present disclosure and includes steps described below.

In S1, a transfer substrate is provided. The transfer substrate includes a plurality of object setting regions which are arranged in an array and configured to place objects to be placed, and the plurality of object setting regions includes n types, where n is a positive integer, and n≥2. The transfer substrate further includes: a base substrate, and a blocking layer located on a side of the base substrate, where the blocking layer forms accommodating grooves respectively within the plurality of object setting regions. Phase change materials are provided in accommodating grooves of at least (n−1) types of object setting regions.

In S2, phase change materials in accommodating grooves of an i-th type of object setting regions are controlled to be subjected to phase change from a solid state to a liquid state or a gas state, and the transfer substrate is placed in an i-th type of to-be-placed object suspension to enable an i-th type of to-be-placed objects to fall into the accommodating grooves corresponding to the phase change materials subjected to the phase change to the liquid state or the gas state.

In S3, the step S2 is circularly performed until corresponding types of to-be-placed objects fall into all accommodating grooves of the n different types of object setting regions.

i is a positive integer less than or equal to n.

According to the transfer substrate, the display panel and the transfer method provided in the present disclosure, phase change materials are provided in the accommodating grooves of object setting regions, so that when no to-be-placed object needs to be transferred, the phase change materials are provided in the accommodating grooves of the object setting regions, and when the to-be-placed objects need to be transferred, the phase change materials in all the accommodating grooves of one type of object setting regions are subjected to phase change, for example, from a solid state to a liquid state or a gas state. At this time, a plurality of to-be-placed objects corresponding to the one type of object setting regions can be provided at one time in the plurality of accommodating grooves in which phase change occurs, and other accommodating grooves cannot be provided with to-be-placed objects due to the fact that phase change materials are provided in these other accommodating grooves. In this way, transfer of one type of to-be-placed objects at one time is achieved, and finally all n types of to-be-placed objects are placed in the corresponding accommodating grooves. Through the transfer substrate of the embodiments, massive transfer of different types of to-beplaced objects can be quickly achieved, the transfer period is shortened, and the transfer efficiency is improved.

DETAILED DESCRIPTION

To make the objects, technical solutions and advantages of the present disclosure clearer, the technical solutions of the present disclosure will be completely described below in conjunction with the specific embodiments and the drawings in the embodiments of the present disclosure. Apparently, the described embodiments are part, not all, of the embodiments of the present disclosure, and based on the embodiments of the present disclosure, other embodiments obtained by those skilled in the art on the premise that no creative work is done are within the scope of the present disclosure.

In view of the problem mentioned in BACKGROUND, a transfer substrate is provided in the embodiments of the present disclosure. The transfer substrate includes a plurality of object setting regions arranged in an array, the plurality of object setting regions including n types, where n is a positive integer, and n≥2. The transfer substrate further includes: a base substrate, and a blocking layer located on a side of the base substrate. The blocking layer forms accommodating grooves respectively within object setting regions. Phase change materials are provided in accommodating grooves of at least (n−1) types of object setting regions.

With the above technical solution, phase change materials are provided in the accommodating grooves of object setting regions, so that when no to-be-placed object needs to be transferred, the phase change materials are provided in the accommodating grooves of the object setting regions, and when the to-be-placed objects need to be transferred, the phase change materials in all the accommodating grooves of one type of object setting regions are subjected to phase change, for example, from a solid state to a liquid state or a gas state. At this time, a plurality of to-be-placed objects corresponding to the one type of object setting regions can be provided at one time in the plurality of accommodating grooves in which phase change occurs, and other accommodating grooves cannot be provided with to-be-placed objects due to the fact that phase change materials are provided in these other accommodating grooves. In this way, transfer of one type of to-be-placed objects at one time is achieved, and finally all n types of to-be-placed objects are placed in the corresponding accommodating grooves. Through the transfer substrate of the embodiments, massive transfer of different types of to-be-placed objects can be quickly achieved, the transfer period is shortened, and the transfer efficiency is improved.

The above is the core idea of the present disclosure, and technical solutions in the embodiments of the present disclosure will be described clearly and completely in conjunction with the drawings in the embodiments of the present disclosure. On the basis of the embodiments of the present disclosure, all other embodiments obtained by those skilled in the art without creative work are within the scope of the embodiments of the present disclosure.

Figure 1:
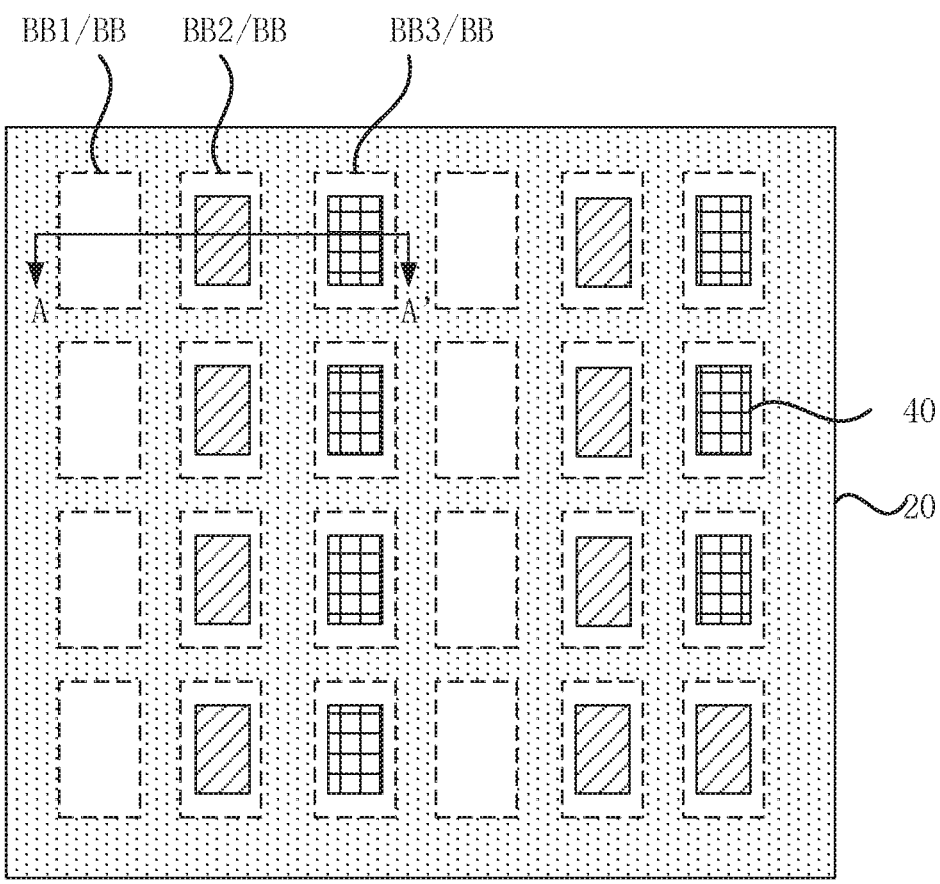
FIG. 1 is a schematic structural view of a transfer substrate according to an embodiment of the present disclosure.
Figure 2:
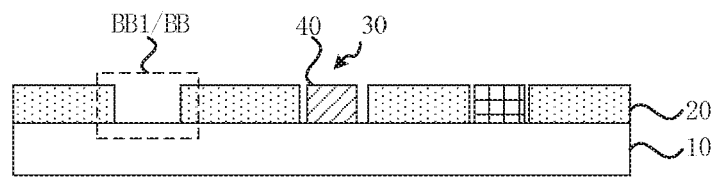
FIG. 2 is a sectional view taken along a line AN of FIG. 1.

FIG. 1 is a schematic structural view of a transfer substrate according to an embodiment of the present disclosure, and FIG. 2 is a sectional view taken along a line AA' of FIG. 1. As shown in FIG. 1 and FIG. 2, a transfer substrate 100 includes a plurality of object setting regions BB which are arranged in an array and configured to place objects to be placed, the plurality of object setting regions including n types, where n is a positive integer, and n≥2; the transfer substrate 100 further includes a base substrate 10 and a blocking layer 20 located on a side of the base substrate 10, where the blocking layer 20 forms accommodating grooves 30 respectively within object setting regions BB, and phase change materials 40 are provided in accommodating grooves 30 of at least (n−1) types of object setting regions BB.

Specifically, the phase change material 40 corresponds to different states of matter, such as a liquid state, a solid state, or even a gas state, at different temperatures.

Specifically, the plurality of object setting regions includes n types, and different types of object setting regions BB are used for transferring different types of to-be-placed objects. Phase change materials 40 are provided in the accommodating grooves 30 of the at least (n−1) types of object setting regions BB, so that when no to-be-placed object needs to be transferred, the phase change materials 40 are provided in the accommodating grooves 30 of the at least (n−1) types of object setting regions BB, and the phase change materials are in a solid state at the moment. When n types of to-be-placed objects need to be transferred, that is, n types of to-be-placed objects need to be provided in the accommodating grooves 30 of all the object setting regions BB, two cases are described below. If the accommodating grooves 30 of the n types of object setting regions BB are all provided with the phase change materials 40, phase change materials 40 in the accommodating grooves 30 of one type of object setting regions BB are all made to be subjected to phase change, for example, to a liquid or a gas, and since solid phase change materials are provided in other accommodating grooves 30, to-be-placed objects cannot be provided in these other accommodating grooves 30. At this time, a plurality of to-be-placed objects corresponding to the one type of object setting regions BB can be provided at one time in the plurality of accommodating grooves 30 in which phase change occurs, and thus transfer of one type of to-be-placed objects are achieved, and finally all the n types of to-be-placed objects are placed in accommodating grooves. If phase change materials 40 are provided in the accommodating grooves 30 of (n−1) types of object setting regions BB, that is, one type of object setting regions BB is not provided with phase change materials 40, firstly, a plurality of to-be-placed objects of the same type are provided at one time in all the accommodating grooves 30 which are provided with no phase change material, and then phase change materials 40 in the accommodating grooves 30 of a second type of object setting regions BB are made to be subjected to phase change. At this time, a plurality of to-be-placed objects of a second type can be provided at one time in the plurality of accommodating grooves 30 in which the phase change occurs, and thus the transfer of the second type of to-be-placed objects are achieved, and finally all the n types of to-be-placed objects are placed in the accommodating grooves 30. In this way, the massive transfer of different types of to-be-placed objects are quickly achieved, the transfer period is shortened, and the transfer efficiency is improved.

Exemplarily, with continued reference to FIGS. 1 and 2, n is three, that is, the plurality of object setting regions BB includes three types, and accordingly, three types of to-be-placed objects need to be placed, and the types of the to-be-placed objects are in one-to-one correspondence with the types of the object setting regions BB, where phase change materials 40 are provided in the accommodating grooves 30 of two types of object setting regions BB. Specifically, the three types of object setting regions BB include a first type of object setting regions BB1, a second type of object setting regions BB2, and a third type of object setting regions BB3. No phase change material 40 is provided in the accommodating grooves 30 of the first type of object setting regions BB1. Phase change materials 40 are separately provided in the accommodating grooves 30 of the second type of object setting regions BB2 and the third type of object setting regions BB3. Specifically, when three types of to-be-placed objects need to be transferred, that is, three types of to-be-placed objects need to be provided in the accommodating grooves 30 of all the object setting regions BB, firstly, the first type of to-be-placed objects are provided at one time in the accommodating grooves 30 of the first type of object setting regions BB1 which are not provided with the phase change materials to finish the transfer of the first type of to-be-placed objects; then phase change materials 40 in the accommodating grooves 30 of the second type of object setting regions BB2 are made to be subjected to phase change, and the second type of to-be-placed objects are provided at one time in the accommodating grooves 30 of the second type of object setting regions BB2 to finish the transfer of the second type of to-be-placed objects; and finally, phase change materials 40 in the accommodating grooves 30 of the third type of object setting regions BB3 are made to be subjected to phase change, and the third type of to-be-placed objects are provided at one time in the accommodating grooves 30 of the third type of object setting regions BB3 to finish the transfer of the third type of to-be-placed objects. In this way, transfer of all the three types of to-be-placed objects are completed.

Figure 3:
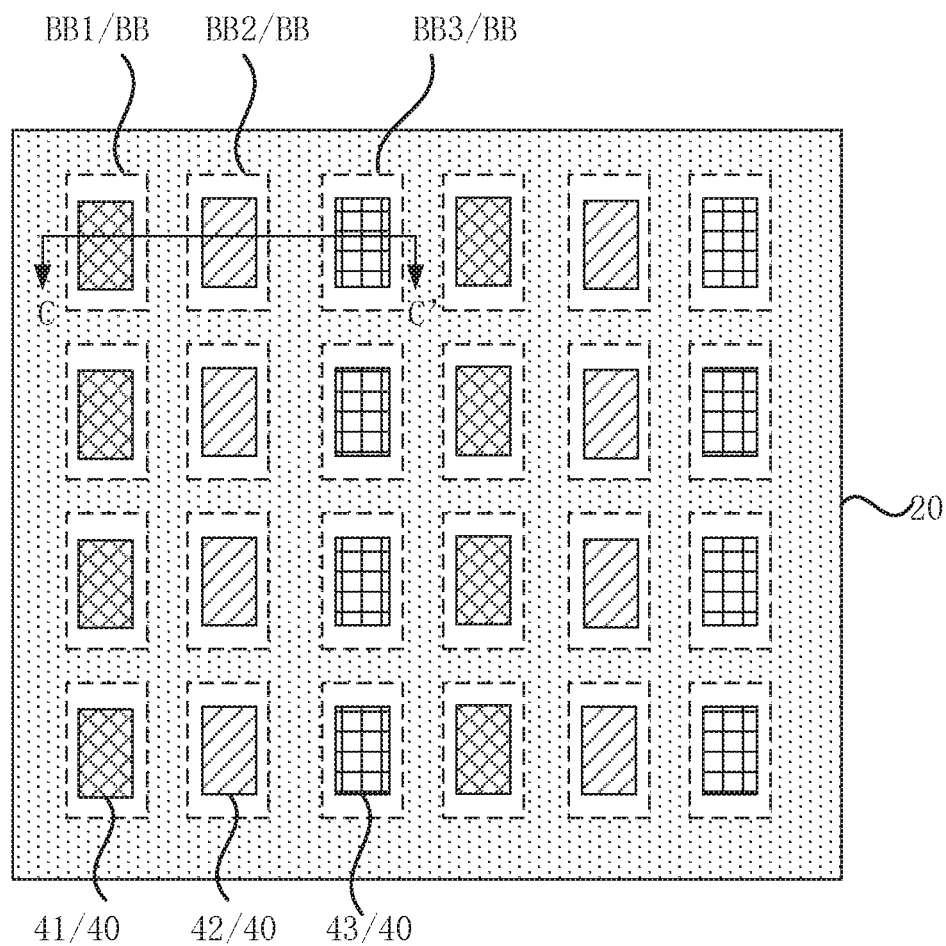
FIG. 3 is a schematic structural view of another transfer substrate according to an embodiment of the present disclosure.
Figure 4:
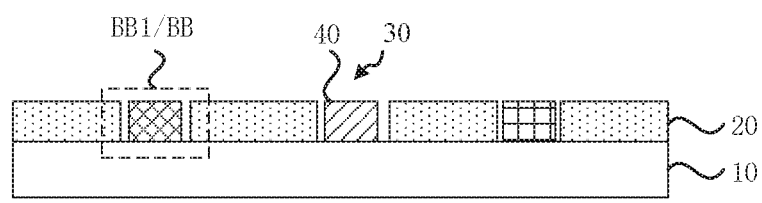
FIG. 4 is a sectional view taken along a line CC' of FIG. 3.

Exemplarily, FIG. 3 is a schematic structural view of another transfer substrate according to an embodiment of the present disclosure, FIG. 4 is a sectional view taken along a line CC' of FIG. 3, and as shown in FIGS. 3 and 4, n is three, that is, the plurality of object setting regions BB includes three types, and accordingly, three types of to-be-placed objects need to be placed, and the types of the to-be-placed objects are in one-to-one correspondence with the types of the object setting regions BB, where phase change materials 40 are provided in all the accommodating grooves 30 of the three types of object setting regions BB. Specifically, the three types of object setting regions BB include a first type of object setting regions BB1, a second type of object setting regions BB2, and a third type of object setting regions BB3. Specifically, when three types of to-be-placed objects need to be transferred, that is, three types of to-be-placed objects need to be provided in the accommodating grooves 30 of all the object setting regions BB, firstly, phase change materials 40 in the accommodating grooves 30 of the first type of object setting regions BB1 are made to be subjected to phase change, and the first type of to-be-placed objects are provided at one time in the accommodating grooves 30 of the first type of object setting regions BB1 to finish the transfer of the first type of to-be-placed objects; then phase change materials 40 in the accommodating grooves 30 of the second type of object setting regions BB2 are made to be subjected to phase change, and the second type of to-be-placed objects are provided at one time in the accommodating grooves 30 of the second type of object setting regions BB2 to finish the transfer of the second type of to-be-placed objects; and finally, phase change materials 40 in the accommodating grooves 30 of the third type of object setting regions BB3 are made to be subjected to phase change, and the third type of to-be-placed objects are provided at one time in the accommodating grooves 30 of the third type of object setting regions BB3 to finish the transfer of the third type of to-be-placed objects. In this way, transfer of all the three types of to-be-placed objects is completed.

Optionally, the base substrate 10 has a supporting and protecting function for other structures in the transfer substrate 100. The base substrate 10 may be a rigid base substrate or a flexible base substrate. When the base substrate is a rigid base substrate, the base substrate 10 may be, for example, glass or the like; when the base substrate 10 is a flexible base substrate, the base substrate may be, for example, polyimide or the like.

Optionally, the phase change material 40 may include, for example, any one of water, disodium hydrogen phosphate dodecahydrate, lauric acid, or calcium chloride hexahydrate. It should be noted that the phase change material 40 in the embodiment is not limited to the above examples, and a method may be used as long as the transfer of the to-be-placed objects can be achieved through phase change of the phase change material 40. The temperatures of different types of object setting regions BB are controlled so that different phase change materials 40 can be filled in the object setting regions BB in a preset state, for example, the phase change materials 40 are in a solid state in the object setting regions BB.

It can be understood that the phase change temperature of the blocking layer 20 needs to be greater than the phase change temperatures of all the phase change materials 40 provided in the different types of object setting regions BB, avoiding the problem that the transfer of to-be-placed objects is affected due to the fact that the blocking layer 20 is also subjected to phase change when the phase change materials 40 provided in the different types of object setting regions BB are subjected to phase change.

Optionally, the material of the blocking layer 20 may include, for example, at least one of epoxy resin, polycarbonate, polyimide, polymethyl methacrylate, or the like.

Optionally, the material of the blocking layer 20 is the same as the material of the base substrate 10. When the material of the blocking layer 20 is the same as the material of the base substrate 10, the blocking layer 20 and the base substrate 10 may be integrally formed, simplifying the process steps. In summary, according to the transfer substrate provided in the embodiment of the present disclosure, phase change materials are provided in the accommodating grooves of object setting regions, so that when no to-be-placed object needs to be transferred, the phase change materials are provided in the accommodating grooves of the object setting regions, and when the to-be-placed objects need to be transferred, the phase change materials in all the accommodating grooves of one type of object setting regions are subjected to phase change. At this time, a plurality of to-be-placed objects corresponding to the one type of object setting regions can be provided at one time in the plurality of accommodating grooves in which phase change occurs, and other accommodating grooves cannot be provided with to-be-placed objects due to the fact that phase change materials are provided in these other accommodating grooves. In this way, transfer of the one type of to-be-placed objects at one time is achieved, and finally all n types of to-be-placed objects are placed in the corresponding accommodating grooves. Through the transfer substrate of the embodiment, massive transfer of different types of to-be-placed objects can be quickly achieved, the transfer period is shortened, and the transfer efficiency is improved.

Optionally, the plurality of object setting regions includes n types of light-emitting element setting regions with different wavebands.

The n types of light-emitting element setting regions with different wavebands are used for transferring light-emitting elements with n wavebands. The light-emitting element may include, for example, a Micro LED or a Mini Light Diode (Mini LED). For example, the light-emitting element is a Micro LED, that is, a massive number of Micro LEDs are transferred, i.e., Micro LEDs of different colors are transferred to a transfer substrate, and the Micro LEDs of different colors are transferred to preset positions in a target substrate at one time through the transfer substrate.

Figure 5:
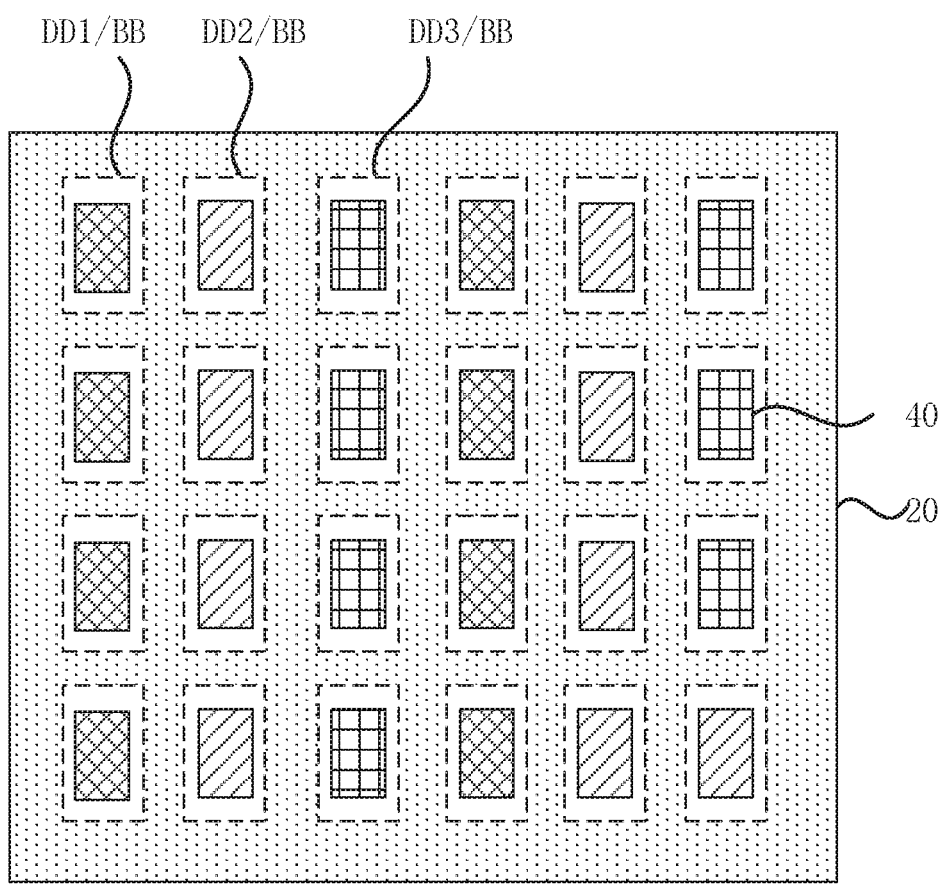
FIG. 5 is a schematic structural view of another transfer substrate according to an embodiment of the present disclosure.

Exemplarily, FIG. 5 is a schematic structural view of another transfer substrate according to an embodiment of the present disclosure, and as shown in FIG. 5, a plurality of object setting regions BB includes a first Micro LED setting region DD1, a second Micro LED setting region DD2 and a third Micro LED setting region DD3. The first Micro LED setting region DD1 is used for transferring the first Micro LED, where the light-emitting color of the first Micro LED is a first color, and the first color may be, for example, red. The second Micro LED setting region DD2 is used for transferring the second Micro LED, where the light-emitting color of the second Micro LED is a second color, and the second color may be, for example, green. The third Micro LED setting region DD3 is used for transferring the third Micro LED, where the light-emitting color of the third Micro LED is a third color, and the third color may be, for example, blue. The first Micro LED setting regions DD1, the second Micro LED setting regions DD2, and the third Micro LED setting regions DD3 are each provided with the phase change material 40. Specifically, when massive numbers of first Micro LEDs, second Micro LEDs and third Micro LEDs need to be transferred, that is, the first Micro LEDs, the second Micro LEDs and the third Micro LEDs need to be placed in the accommodating grooves 30 of all the object setting regions BB, firstly, phase change materials 40 in the accommodating grooves 30 of the first Micro LED setting regions DD1 are made to be subjected to phase change, and the first Micro LEDs are provided at one time in the accommodating grooves 30 of the first Micro LED setting regions DD1 to finish the transfer of the first Micro LEDs. Then, phase change materials 40 in the accommodating grooves 30 of the second Micro LED setting regions DD2 are made to be subjected to phase change, and the second Micro LEDs are provided at one time in the accommodating grooves 30 of the second Micro LED setting regions DD2 to finish the transfer of the second Micro LEDs. Finally, phase change materials 40 in the accommodating grooves 30 of the third Micro LED setting regions DD3 are made to be subjected to phase change, and the third Micro LEDs are provided at one time in the accommodating grooves 30 of the third Micro LED setting regions DD3 to finish the transfer of the third Micro LEDs. In this way, transfer of all the Micro LEDs are completed, that is, all Micro LEDs of three colors are transferred to the transfer substrate 100, and then the Micro LEDs of different colors are transferred to the preset positions in the target substrate at one time through the transfer substrate 100, thus improving the efficiency of massive transfer of Micro LEDs and ensuring relatively high transfer yield.

It should be noted that the above embodiment takes the transfer of Micro LEDs as an example, but does not constitute a limitation to the present disclosure, and a method may be used as long as transfer of n types of light-emitting elements with different wavebands can be achieved.

Optionally, when n≥3, phase change temperatures of phase change materials provided in accommodating grooves of different types of object setting regions are different.

Exemplarily, with continued reference to FIG. 3, the plurality of object setting regions BB includes three types, and the three types of object setting regions BB include a first type of object setting regions BB1, a second type of object setting regions BB2, and a third type of object setting regions BB3; a first phase change material 41 is provided in the accommodating groove 30 of the first type object setting region BB1, and the phase change temperature of the first phase change material 41 is 40° C.; a second phase change material 42 is provided in the accommodating groove 30 of the second type object setting region BB2, and the phase change temperature of the second phase change material 42 is 50° C.; a third phase change material 43 is provided in the accommodating groove 30 of the third type object setting region BB3, and the phase change temperature of the third phase change material 43 is 60° C. Specifically, when three types of to-be-placed objects need to be transferred, that is, three types of to-be-placed objects need to be provided in the accommodating grooves 30 of all the object setting regions BB, the temperature of the environment where the transfer substrate 100 is located is controlled to be 40° C., and thus, first phase change materials 41 in the accommodating grooves 30 of the first type of object setting regions BB1 are subjected to phase change, for example, from a solid state to a gas state or a liquid state, and then the first third type of to-be-placed objects are provided at one time in the accommodating grooves 30 of the first type of object setting regions BB1 to finish the transfer of the first third type of to-be-placed objects. Then, the temperature of the environment where the transfer substrate 100 is located is controlled to be 50° C., and thus, second phase change materials 42 in the accommodating grooves 30 of the second type of object setting regions BB2 are subjected to phase change, for example, from a solid state to a gas state or a liquid state. At this time, since the first third type of to-be-placed objects has already been provided in the accommodating grooves 30 of the first type of object setting regions BB1 and third phase change materials 43 in the accommodating grooves 30 of the third type of object setting regions BB3 cannot be subjected to phase change at 50° C., that is, are still in the solid state, the second type of to-be-placed objects can be provided at one time in the accommodating grooves 30 of the second type of object setting regions BB2 to finish the transfer of the second type of to-be-placed objects. Finally, the temperature of the environment where the transfer substrate 100 is located is controlled to be 60° C., and thus, the third phase change materials 43 in the accommodating grooves 30 of the third type of object setting regions BB3 are subjected to phase change, for example, from a solid state to a gas state or a liquid state. At this time, since the first third type of to-be-placed objects has already been provided in the accommodating grooves 30 of the first type of object setting regions BB1 and the second type of to-be-placed objects has already been provided in the accommodating grooves 30 of the second type of object setting regions BB2, the third type of to-be-placed objects can be provided at one time in the accommodating grooves 30 of the third type of object setting regions BB3 to finish the transfer of the third type of to-be-placed objects. In this way, transfer of the three types of to-be-placed objects is completed.

It should be noted that in the above example, the phase change of the phase change material is achieved through a control of the temperature of the environment where the transfer substrate 100 is located, but such method does not constitute a limitation to the present disclosure, and a method may be used as long as the transfer of the to-be-placed objects can be achieved through the phase change of the phase change material. For example, the temperature of the base substrate 10 and the like can be controlled to achieve the purpose of phase change of the phase change material.

Optionally, no phase change material is provided in accommodating grooves of a j-th type of object setting regions, where j is a positive integer less than or equal to n.

With continued reference to FIG. 1, when no phase change material is provided in the accommodating grooves of the j-th type of object setting regions, the to-be-placed objects corresponding to the j-th type of object setting regions can be transferred first, and then other types of to-be-placed objects are transferred. FIG. 1 illustrates, by way of example, that no phase change material is provided in the accommodating grooves 30 of merely the first type of object setting regions BB1. Optionally, the case may also be that no phase change material is provided in the accommodating grooves 30 of merely the second type of object setting region BB2 (not shown in the figure) or that no phase change material is provided in the accommodating grooves 30 of merely the third type of object setting regions BB3 (not shown in the figure). In the embodiment, the number of phase change materials 40 can be reduced and the cost is reduced.

Optionally, when n≥3, a difference between every two phase change temperatures of phase change materials provided in accommodating grooves of the n types of object setting regions is greater than or equal to 4° C.

Such setting has the advantages of avoiding the problem that transfer of the to-be-placed objects is affected due to the fact that when one type of phase change material is subjected to phase change, another type of phase change material may also be subjected to phase change since the phase change temperature difference is small and improving the reliability of the transfer substrate.

Optionally, phase change materials are provided in accommodating grooves of all of n types of object setting regions; and phase change temperatures of the phase change materials in all the accommodating grooves are the same.

Specifically, when the phase change temperatures of the phase change materials in all the accommodating grooves are the same, the phase change of the phase change materials in corresponding regions can be controlled through a change of the temperature of a local region. For example, phase change materials are provided in accommodating grooves of both the two types of object setting regions; and phase change temperatures of the phase change materials in all the accommodating grooves are the same. In this case, the temperatures of the first type of object setting regions are first controlled to make the phase change materials in the corresponding accommodating grooves be subjected to phase change. Since the temperatures of the second type of object setting regions are unchanged, the phase change materials in the accommodating grooves of the second type of object setting regions are not subjected to phase change, so that the transfer of the first type of to-be-placed objects can be completed. Then, the temperatures of the second type of object setting regions are controlled to make the phase change materials in the corresponding accommodating grooves be subjected to phase change, so that the transfer of the second type of to-be-placed objects is completed. In the embodiment, the phase change temperatures of the phase change materials in the accommodating grooves are the same, so that the phase change materials can be simultaneously provided in the accommodating grooves, thus simplifying the process steps.

Figure 6:
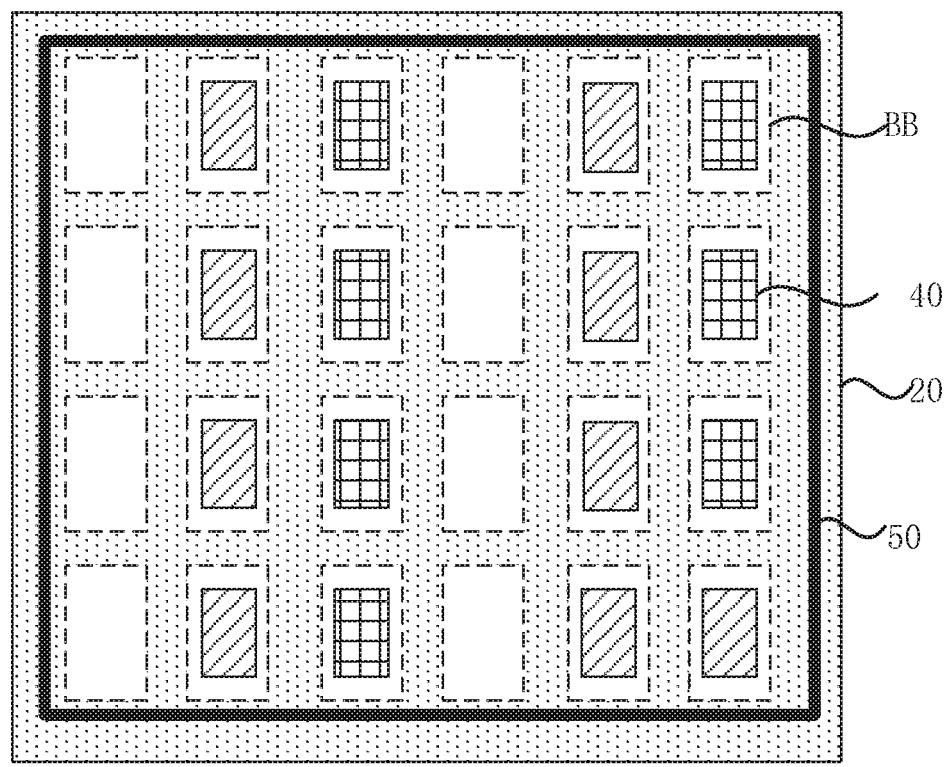
FIG. 6 is a schematic structural view of another transfer substrate according to an embodiment of the present disclosure.

Optionally, FIG. 6 is a schematic structural view of another transfer substrate according to an embodiment of the present disclosure, and as shown in FIG. 6, the transfer substrate 100 further includes at least one heating line 50 for controlling the phase change of phase change materials 40.

Exemplarily, with continued reference to FIG. 6, when the phase change temperatures of the phase change materials 40 provided in the accommodating grooves of different types of object setting regions BB are different, different temperatures can be provided by a heating line 50 separately, so that the phase change materials 40 provided in the accommodating grooves of different types of object setting regions BB are separately subjected to phase change according to the temperature provided by the heating line 50.

Figure 7:
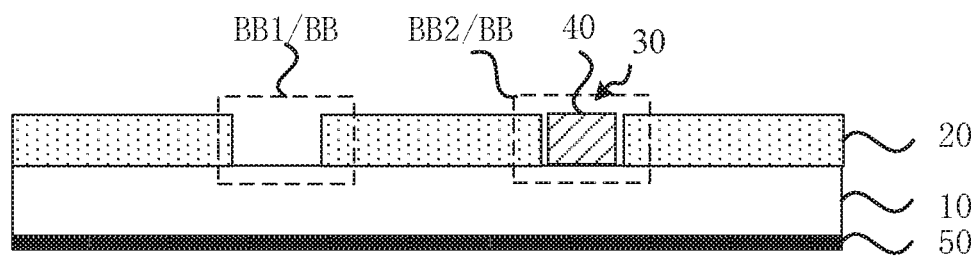
FIG. 7 is a schematic structural view of a film structure of another transfer substrate according to an embodiment of the present disclosure.
Figure 8:
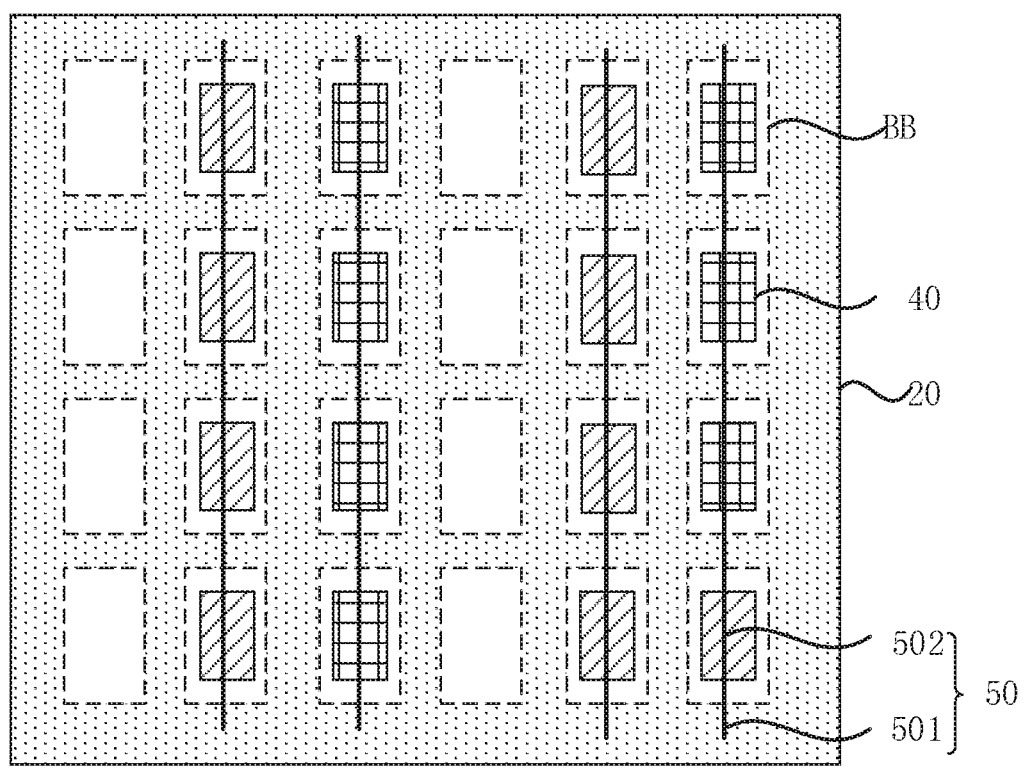
FIG. 8 is a schematic view of another transfer substrate according to an embodiment of the present disclosure.

Exemplarily, FIG. 7 is a schematic view of a film structure of a transfer substrate according to an embodiment of the present disclosure, and as shown in FIG. 7, a heating line 50 is provided on the entire surface of one side of the base substrate 10 facing away from the blocking layer 20; when the phase change temperatures of the phase change materials 40 provided in the accommodating grooves 30 of different types of object setting regions BB are different, different temperatures can be separately provided by the heating line 50 on the entire surface, so that the phase change materials 40 provided in the accommodating grooves of the different types of object setting regions BB are separately subjected to phase change according to the temperature provided by the heating line 50. Since the heating line 50 is disposed on the entire surface, the heating line 50 can uniformly provide the phase change temperature for the phase change materials 40, i.e., the consistency of phase change of the phase change materials 40 provided in the accommodating grooves 30 of the same type of to-be-placed setting regions BB is improved. For example, for transfer of two types of to-be-placed objects, accordingly, different types of object setting regions BB include a first type of object setting regions BB1 and a second type of object setting regions BB2; no phase change material 40 is provided in the accommodating grooves corresponding to the first type of object setting regions BB1, and phase change materials 40 are provided in the accommodating grooves corresponding to the second type of object setting regions BB2; firstly, a plurality of to-be-placed objects of the same type are provided at one time in all the accommodating grooves 30 which are provided with no phase change material, and then phase change materials 40 in the accommodating grooves 30 of the second type of object setting region BB2 are controlled to be simultaneously subjected to phase change through the heating line 50 on the entire surface; at this time, a plurality of to-be-placed objects of a second type can be provided at one time in the plurality of accommodating grooves 30 in which the phase change occurs, and thus the transfer of the second type of to-be-placed objects is achieved. Exemplarily, FIG. 8 is a schematic structural view of another transfer substrate according to an embodiment of the present disclosure, and as shown in FIG. 8, when the phase change temperatures of the phase change materials 40 in all the accommodating grooves are the same, a plurality of heating lines 50 is provided and separately provides the phase change temperatures for the phase change materials 40 in the accommodating grooves of different types of object setting regions BB to make the phase change materials 40 in the accommodating grooves of object setting regions BB corresponding to a heating line 50 be subjected to phase change.

Figure 9:
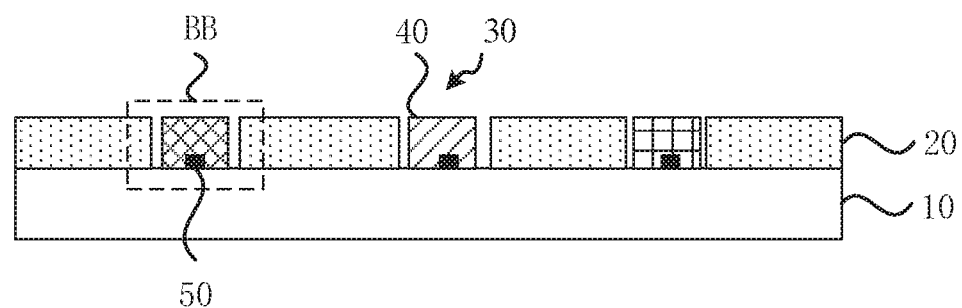
FIG. 9 is a schematic view of a film structure of another transfer substrate according to an embodiment of the present disclosure.
Figure 10:
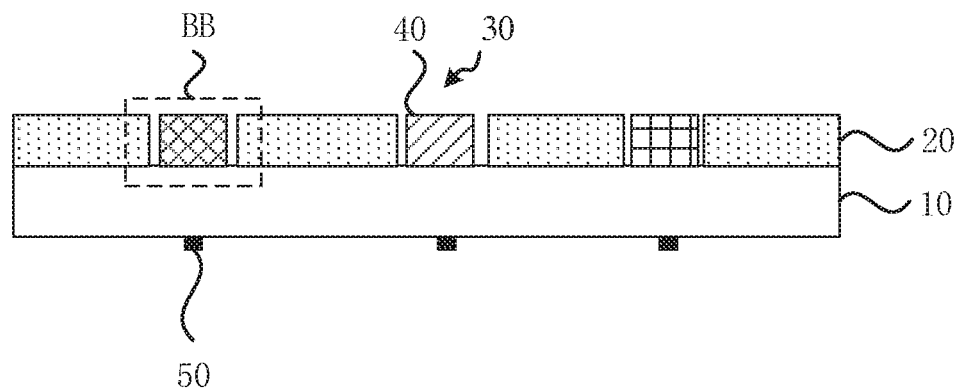
FIG. 10 is a schematic structural view of a film structure of another transfer substrate according to an embodiment of the present disclosure.

It should be noted that the embodiment does not limit the specific position of the heating line. Optionally, FIG. 9 is a schematic view of a film structure of a transfer substrate according to an embodiment of the present disclosure, and as shown in FIG. 9, a heating line 50 is located between the base substrate 10 and the blocking layer 20. Since the heating line 50 is relatively adjacent to the phase change material 40, the efficiency of phase change of the phase change material 40 can be improved. Optionally, FIG. 10 is a schematic structural view of a film structure of another transfer substrate according to an embodiment of the present disclosure, and as shown in FIG. 10, the heating line 50 may further be located on a side of the base substrate 10 facing away from the blocking layer 20. Optionally, the heating line may not be on the transfer substrate (not shown in the figure), but the temperature at the position of the phase change material can be controlled.

Figure 11:
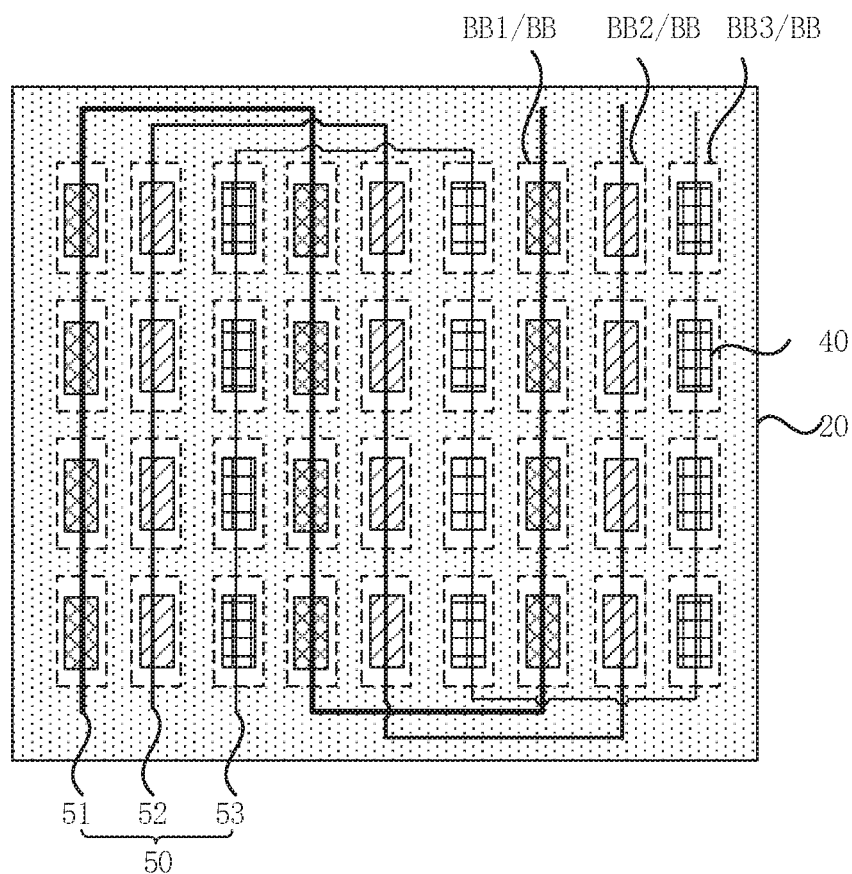
FIG. 11 is a schematic structural view of another transfer substrate according to an embodiment of the present disclosure.

Optionally, FIG. 11 is a schematic structural view of another transfer substrate according to an embodiment of the present disclosure, and as shown in FIG. 11, phase change materials 40 provided in accommodating grooves of a same type of object setting regions are controlled by a same heating line 50 to be subjected to phase change.

Exemplarily, the plurality of object setting regions BB includes three types, and the three types of object setting regions BB include a first type of object setting regions BB1, a second type of object setting regions BB2, and a third type of object setting regions BB3; the phase change materials 40 in the different types of object setting regions BB may be the same, i.e., the phase change temperatures being the same, and may be different, i.e., the phase change temperatures being different, and by way of example, the phase change materials 40 in different types of object setting regions BB are different in FIG. 10, and the phase change temperatures are a first temperature, a second temperature and a third temperature, respectively; the phase change materials 40 provided in the accommodating grooves 30 of the first type of object setting regions BB1 are controlled by a first heating line 51 to be subjected to phase change; the phase change materials 40 provided in the accommodating grooves 30 of the second type of object setting regions BB2 are controlled by a second heating line 52; and the phase change materials 40 provided in the accommodating grooves of the third type of object setting regions BB3 are controlled by a third heating line 53 to be subjected to phase change. Specifically, when three types of to-be-placed objects need to be transferred, that is, three types of to-be-placed objects need to be provided in the accommodating grooves 30 of all the object setting regions BB, firstly, a first temperature is provided by the first heating line 51 so that phase change materials 40 in the accommodating grooves 30 of the first type of object setting regions BB1 are made to be subjected to phase change, and the first third type of to-be-placed objects are provided at one time in the accommodating grooves 30 of the first type of object setting regions BB1 to finish the transfer of the first third type of to-be-placed objects. Then, a second temperature is provided by the second heating line 52 so that phase change materials 40 in the accommodating grooves 30 of the second type of object setting regions BB2 are made to be subjected to phase change, and the second type of to-be-placed objects are provided at one time in the accommodating grooves 30 of the second type of object setting regions BB2 to finish the transfer of the second type of to-be-placed objects. Finally, a third temperature is provided by the third heating line 53 so that phase change materials 40 in the accommodating grooves 30 of the third type of object setting regions BB3 are made to be subjected to phase change, and the third type of to-be-placed objects are provided at one time in the accommodating grooves 30 of the third type of object setting regions BB3 to finish the transfer of the third type of to-be-placed objects. In this way, transfer of the three types of to-be-placed objects is completed. In the embodiment, the phase change materials 40 provided in the accommodating grooves 30 of the same type of object setting regions BB are controlled by the same heating line 50 to be subjected to phase change. In this way, for example, when the heating line 50 is provided with a signal through a chip to be enabled to provide a corresponding phase change temperature, the number of chip terminals can be reduced, and chip cost can be saved. Meanwhile, the consistency of phase change of the phase change materials 40 provided in the accommodating grooves of the same type of object setting regions BB is ensured, and thus the consistency of transferring the same type of to-be-placed objects to the transfer substrate 100 is ensured.

Figure 12:
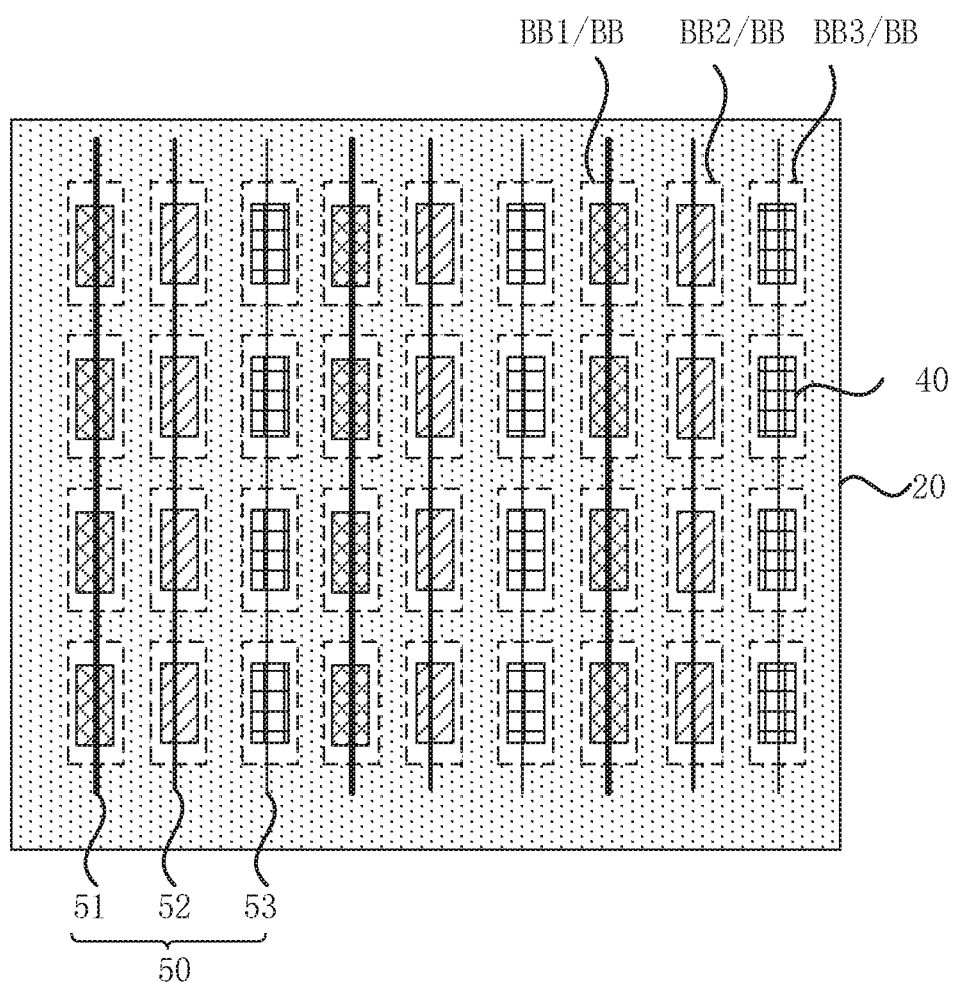
FIG. 12 is a schematic structural view of another transfer substrate according to an embodiment of the present disclosure.

Optionally, FIG. 12 is a schematic structural view of another transfer substrate according to an embodiment of the present disclosure, and as shown in FIG. 12, among the plurality of object setting regions BB arranged in an array, phase change materials 40 provided in accommodating grooves of a same type of object setting regions BB located in a same column or a same row are controlled by a same heating line 50 to be subjected to phase change. In this way, the heating line 50 are located in many regions, and the heating lines 50 located in different regions can be controlled independently, which is suitable for transferring more than three types of object setting regions BB and flexible for control.

Figure 13:
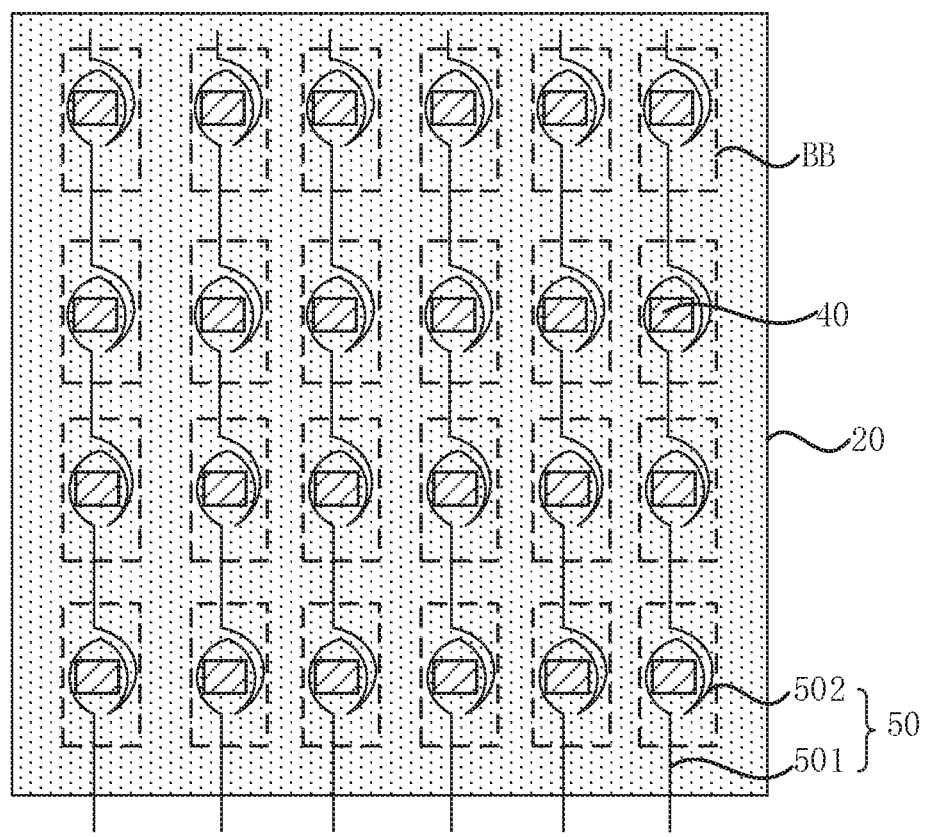
FIG. 13 is a schematic structural view of another transfer substrate according to an embodiment of the present disclosure.

Optionally, with continued reference to FIG. 8, a heating line 50 includes a first portion 501 and a second portion 502; a vertical projection of the second portion 502 on a plane where the base substrate 10 is located at least partially overlaps a vertical projection of the accommodating groove on the plane where the base substrate 10 is located. Alternatively, FIG. 13 is a schematic structural view of another heating line according to an embodiment of the present disclosure, and as shown in FIG. 13, at least part of a vertical projection of the second portion 502 on a plane where the base substrate 10 is located surrounds a vertical projection of the accommodating groove on the plane where the base substrate 10 is located.

It can be understood that since the phase change material 40 is provided in the accommodating groove, the position relationship between the vertical projection of the second portion 502 on the plane where the base substrate 10 is located and the vertical projection of the accommodating groove on the plane where the base substrate 10 is located is the position relationship between the vertical projection of the second portion 502 on the plane where the base substrate 10 is located and the vertical projection of the phase change material 40 on the plane where the base substrate 10 is located. Therefore, FIGS. 7 and 12 merely show the phase change materials 40, and do not show the accommodating grooves.

Specifically, since the heating line 50 provides the phase change temperature for the phase change material 40, the second portion 502 is disposed directly above or directly below the phase change material 40 or around the phase change material 40 in the embodiment, thus ensuring the phase change speed of the phase change material 40 and further improving the transfer speed.

Optionally, when the second portion 502 is disposed directly above the phase change material 40, the phase change temperature for the phase change material 40 can be provided by providing an external heating line 50, i.e., the heating line 50 is not disposed on the transfer substrate 100, so as to ensure the phase change speed of the phase change material 40. Optionally, a direct current voltage can be applied to the heating line so that the heating line can provide a phase change temperature. Since the current in the same heating line is the same, the heating power can be provided through an increase in the resistance of the second portion of the heating line, thus improving the phase change speed of the phase change material.

Figure 14:
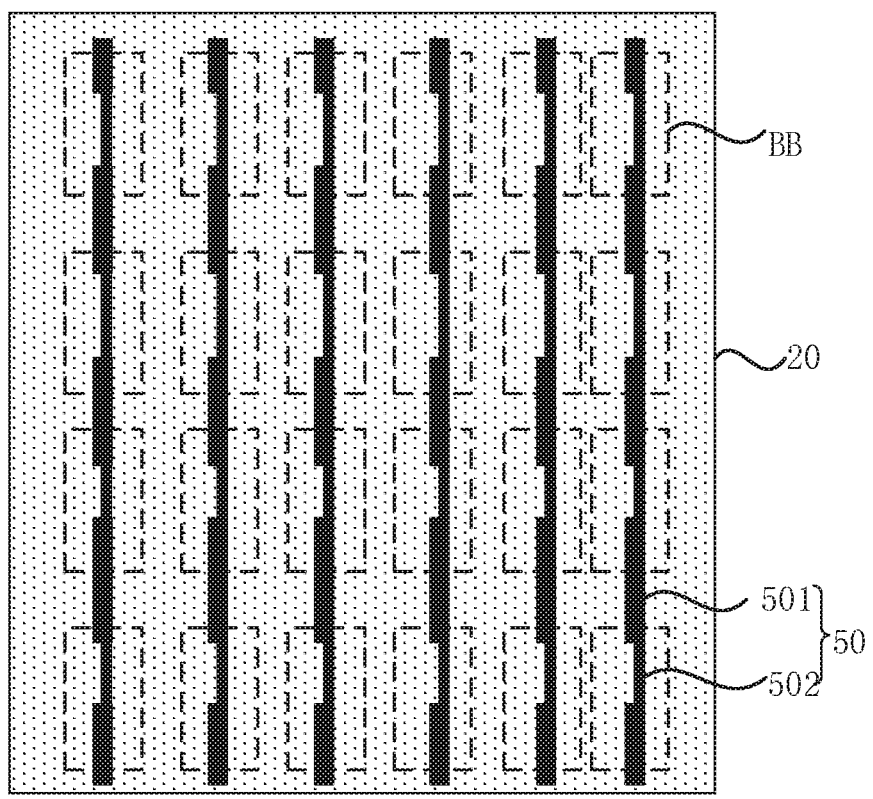
FIG. 14 is a schematic structural view of another transfer substrate according to an embodiment of the present disclosure.

Optionally, FIG. 14 is a schematic structural view of another transfer substrate according to an embodiment of the present disclosure, and as shown in FIG. 14, a resistance per unit length of the second portion 502 is greater than a resistance per unit length of the first portion 501.

Specifically, it can be seen from $R=(\rho L)/S$ that the area of the cross-section of the second portion 502 on the plane perpendicular to the column direction can be set to be smaller than the area of the cross-section of the first portion 501 on the plane perpendicular to the column direction so that the resistance per unit length of the second portion 502 is greater than the resistance per unit length of the first portion 501.

Figure 15:
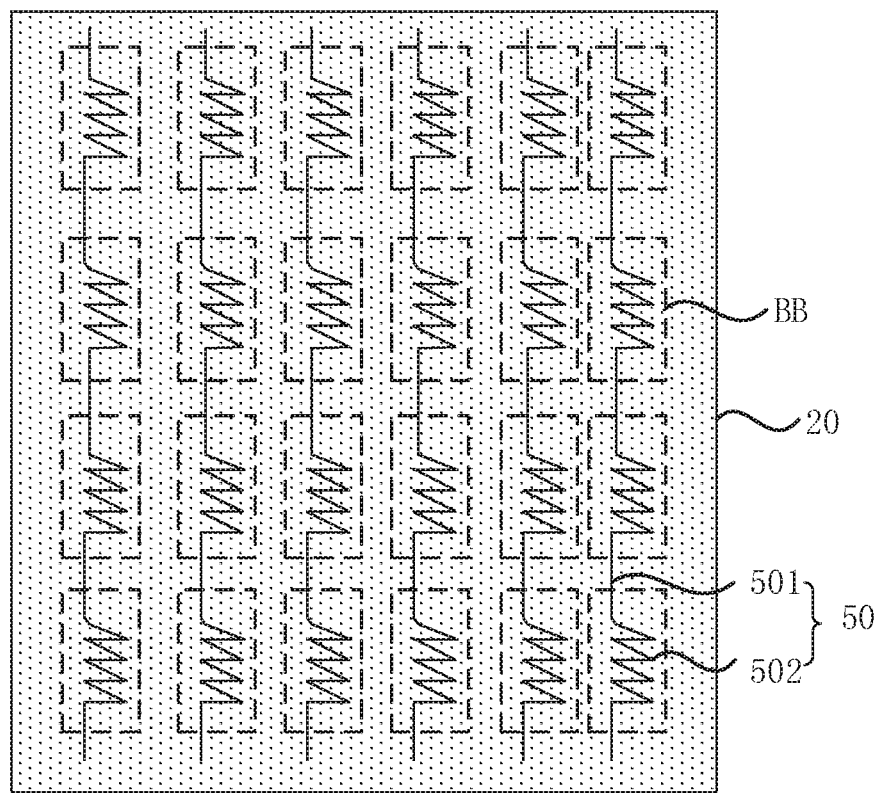
FIG. 15 is a schematic structural view of another transfer substrate according to an embodiment of the present disclosure.

Optionally, FIG. 15 is a schematic structural view of another transfer substrate according to an embodiment of the present disclosure, and as shown in FIG. 15, a shape of the vertical projection of the second portion 502 on the plane where the base substrate 10 is located has at least one of a straight line, a broken line, or a curved line.

Specifically, it can be seen from $R=(\rho L)/S$ that the length of the second portion 502 can be increased so that the resistance of the second portion 502 is greater than the resistance of the first portion 501.

It should be noted that by way of example, the vertical projection of the second portion on the plane where the base substrate 10 is located has a shape of a broken line in FIG. 15. In other optional embodiments, the shape of the vertical projection may also be spiral, for example, continued reference is made to FIG. 13.

It can be understood that, in order to clearly show the shape of the heating line 50, FIGS. 14 and 15 merely show the heating line and do not show the phase change material. Configuration in the following embodiment is also same as the configuration described above. Repetition will not be made here.

Figure 16:
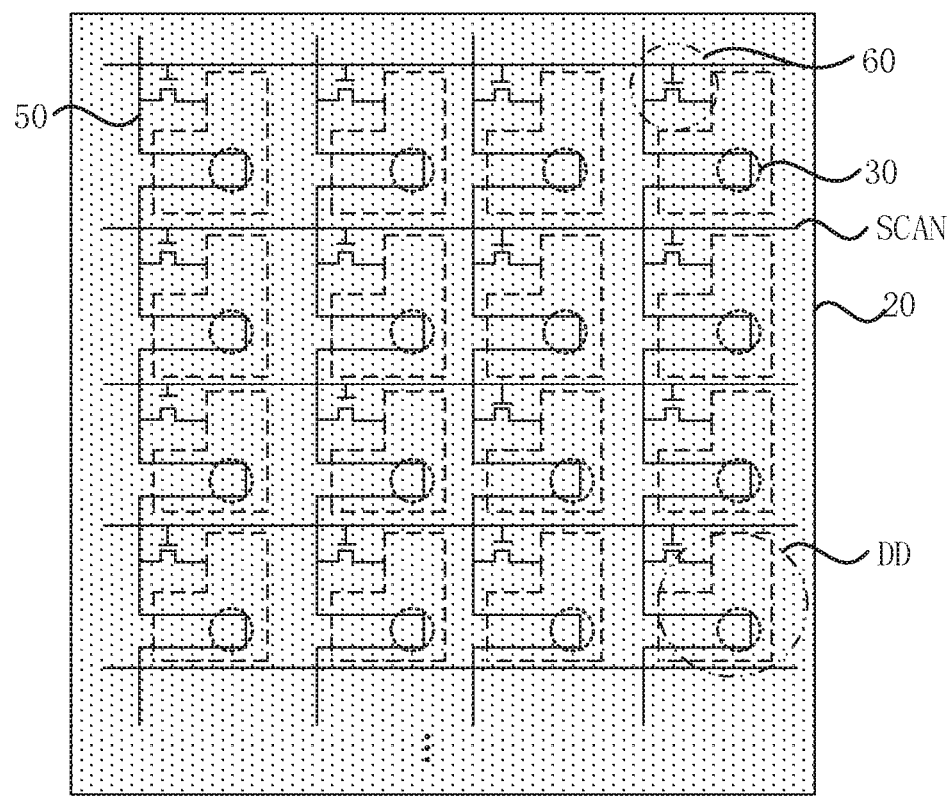
FIG. 16 is a schematic structural view of another transfer substrate according to an embodiment of the present disclosure.
Figure 17:
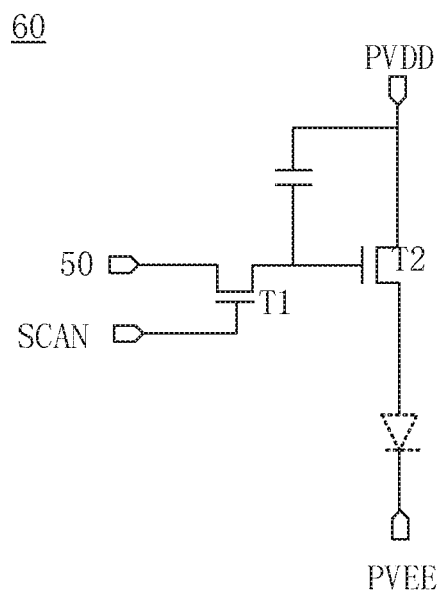
FIG. 17 is an enlarged view of the pixel driving circuit of FIG. 16.

Optionally, FIG. 16 is a schematic structural view of another transfer substrate according to an embodiment of the present disclosure, and FIG. 17 is an enlarged view of the pixel driving circuit of FIG. 16. As shown in FIGS. 16 and 17, the transfer substrate 100 further includes a pixel driving circuit array, the pixel driving circuit array is located between the blocking layer and the base substrate and includes pixel driving circuits 60 arranged in an array, and the pixel driving circuits 60 are in one-to-one correspondence with the accommodating grooves 30.

The transfer substrate 100 may be individually provided. That is, n types of to-be-placed objects are transferred to the transfer substrate 100 first, and then are all transferred at one time to a target substrate through the transfer substrate 100. That is, the to-be-placed objects can be provided on the target substrate through two transfers. The to-be-placed object may be, for example, a Micro LED, and accordingly, the target substrate may include, for example, a substrate having a driving circuit. The array substrate in the display panel may also be multiplexed as the transfer substrate. Referring to FIG. 16, the array substrate includes n types of light-emitting element setting regions DD with different wavebands. Phase change materials in the accommodating grooves 30 of light-emitting element setting regions with the same waveband are simultaneously subjected to phase change while phase change materials in the accommodating grooves 30 of light-emitting element setting regions with other wavebands are not subjected to phase change, so that transfer of light-emitting elements with a corresponding waveband is completed, and finally n types of light-emitting elements with different wavebands are all provided in the accommodating grooves 30 of the corresponding light-emitting element setting regions. That is, the light-emitting elements can be directly provided on the array substrate through one transfer. The light-emitting element may be, for example, a Micro LED. The transfer steps are simplified and the transfer efficiency is further improved.

Optionally, with continued reference to FIGS. 16 and 17, a pixel driving circuit array further includes a plurality of data lines; each of the plurality of data lines is electrically connected to a respective column of pixel driving circuits among a plurality of columns of pixel driving circuits 60 arranged in the array; and the data lines are multiplexed as the heating lines 50.

The phase change temperature is provided for the phase change material through the data line. Specifically, when the phase change materials in the accommodating grooves 30 of light-emitting element setting regions DD with the same waveband need to be subjected to phase change, the data lines are used for providing the phase change temperature, so that the phase change materials in the accommodating grooves 30 of the light-emitting element setting regions DD corresponding to the data lines are subjected to phase change to finish the transfer of the light-emitting elements with a corresponding waveband. Finally, n types of light-emitting elements with different wavebands are all provided in the accommodating grooves 30 of the corresponding light-emitting element setting regions DD. When a data signal needs to be written, a data writing transistor T1 in the pixel driving circuit 60 is controlled by a control signal supplied from the scanning line SCAN to transmit the data signal voltage supplied from the data line to the gate electrode of a drive transistor T2, so that the drive transistor T2 generates a driving current under the action of the data signal, a first power supply signal supplied by a first power supply line and a second power supply signal supplied by a second power supply line to drive the light-emitting element to emit light. According to the technical solution, the array substrate is multiplexed as the transfer substrate 100 and the data line is multiplexed as the heating line 50, so that the transfer substrate and the heating line do not need to be individually provided, the cost is reduced, and the process steps are simplified.

It should be noted that FIG. 16 merely shows one shape of the data line, but the shape does not constitute a limitation to the present disclosure, and a shape may be used as long as the data line can control the phase change of the phase change material in the corresponding accommodating groove.

It can be understood that by way of example, the pixel driving circuit 60 in FIG. 16 and FIG. 17 includes one capacitor and two thin film transistors, but such configuration does not constitute a limitation to the present disclosure. In other optional embodiments, the pixel driving circuit 60 may also include one capacitor and seven thin film transistors, or the like.

Figure 18:
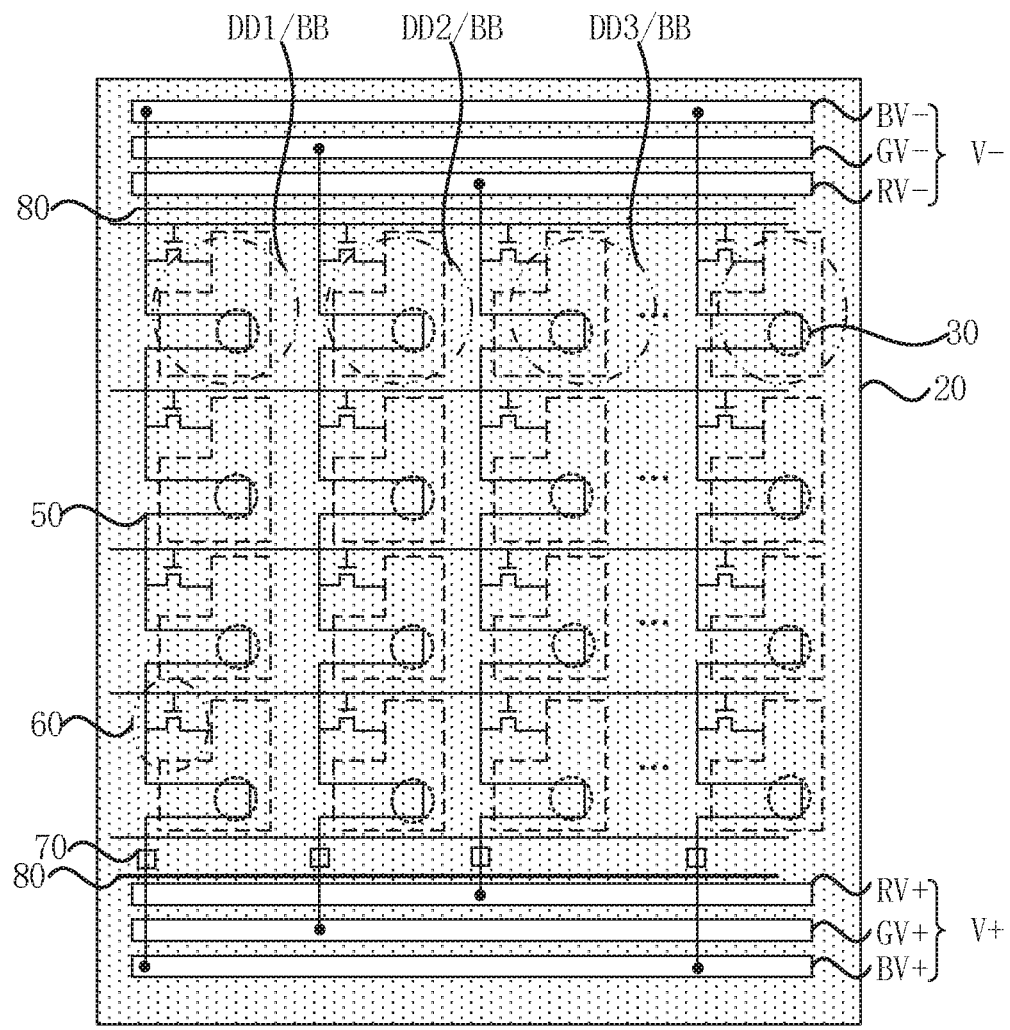
FIG. 18 is a schematic view of a film structure of another transfer substrate according to an embodiment of the present disclosure.

Optionally, FIG. 18 is a schematic structural view of another transfer substrate according to an embodiment of the present disclosure. As shown in FIG. 18, the array substrate further includes n first heating power supply terminals V+ and n second heating power supply terminals V−; one end of a heating line 50 corresponding to phase change materials provided in the accommodating grooves 30 of a same type of object setting region BB is connected to a same first heating power supply terminal V+, and the other end of the heating line 50 corresponding to the phase change materials provided in the accommodating grooves 30 of the same type of object setting regions is connected to a same second heating power supply terminal V−.

Exemplarily, a plurality of object setting regions BB includes three types, that is, a first Micro LED setting region DD1, a second Micro LED setting region DD2 and a third Micro LED setting region DD3. The first Micro LED setting region DD1 is used for transferring the first Micro LED, where the light-emitting color of the first Micro LED is a first color, and the first color may be, for example, red. The second Micro LED setting region DD2 is used for transferring the second Micro LED, where the light-emitting color of the second Micro LED is a second color, and the second color may be, for example, green. The third Micro LED setting region DD3 is used for transferring the third Micro LED, where the light-emitting color of the third Micro LED is a third color, and the third color may be, for example, blue. Accordingly, the array substrate further includes three first heating power supply terminals V+ and three second heating power supply terminals V−, that is, a red heating power supply terminal RV+ and a red heating power supply terminal RV−, a green heating power supply terminal GV+ and a green heating power supply terminal GV−, and a blue heating power supply terminal BV+ and a blue heating power supply terminal BV−. The first Micro LED setting region DD1, the second Micro LED setting region DD2, and the third Micro LED setting region DD3 are each provided with the phase change material 40. Specifically, when massive numbers of red Micro LEDs, green Micro LEDs and blue Micro LEDs need to be transferred, that is, the red Micro LEDs, the green Micro LEDs and the third Micro LEDs need to be placed in the accommodating grooves 30 of all the object setting regions BB, phase change signals are provided for the heating lines 50 corresponding to all the first Micro LED setting regions DD1 through the red heating power supply terminal RV+ and the red heating power supply terminal RV−, so that phase change materials 40 in the accommodating grooves 30 of the first Micro LED setting regions DD1 are made to be subjected to phase change, and the red Micro LEDs are provided at one time in the accommodating grooves 30 of the first Micro LED setting regions DD1 to finish the transfer of the red Micro LEDs. Then, phase change signals are provided for the heating lines 50 corresponding to all the second Micro LED setting regions DD2 through the green heating power supply terminal GV+ and the green heating power supply terminal GV−, so that phase change materials 40 in the accommodating grooves 30 of the second Micro LED setting regions DD2 are made to be subjected to phase change, and the green Micro LEDs are provided at one time in the accommodating grooves 30 of the second Micro LED setting regions DD2 to finish the transfer of the green Micro LEDs. Finally, phase change signals are provided for the heating lines 50 corresponding to all the third Micro LED setting regions DD3 through the blue heating power supply terminal BV+ and the blue heating power supply terminal BV−, so that phase change materials 40 in the accommodating grooves 30 of the third Micro LED setting regions DD3 are made to be subjected to phase change, and the blue Micro LEDs are provided at one time in the accommodating grooves 30 of the third Micro LED setting regions DD3 to finish the transfer of the blue Micro LEDs. In this way, transfer of all the Micro LEDs are completed, that is, all Micro LEDs of three colors are transferred to the transfer substrate, thus improving the efficiency of massive transfer of Micro LEDs and ensuring relatively high transfer yield.

Optionally, with continued reference to FIG. 18, the first heating power supply terminal V+ and the second heating power supply terminal V− may be multiplexed as pointing screen test terminals, and in a pointing screen test phase, a pointing screen test signal is provided for the corresponding sub-pixel via the first heating power supply terminal V+ and the second heating power supply terminal V−.

Optionally, with continued reference to FIG. 18, a plurality of bonding pads 70 are further disposed between the first heating power source terminal V+ and the pixel driving circuit array; and each heating line 50 is electrically connected to a corresponding first heating power supply terminal V+ through a bonding pad 70. When the pointing screen test is completed, cutting is performed along a cutting line 80 so that the bonding pad 70 is disconnected from the first heating power source terminal V+, and the second heating power source terminal V− is disconnected from the heating line 50. Then, electrical connection to the driving chip or the flexible circuit board through a bonding pad 70 is made, so that the driving chip or the flexible circuit board can provide a corresponding signal for the pixel driving circuit 60 through the bonding pad 70.

Figure 19:
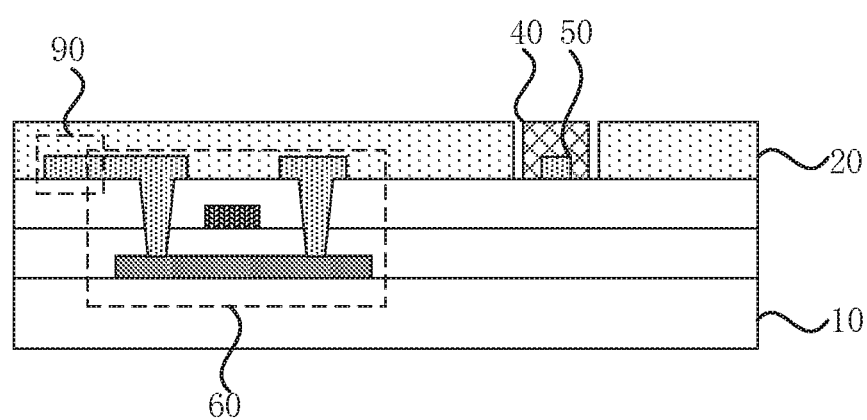
FIG. 19 is a schematic view of a film structure of another transfer substrate according to an embodiment of the present disclosure.

Optionally, FIG. 19 is a schematic view of a film structure of another transfer substrate according to an embodiment of the present disclosure. As shown in FIG. 19, the pixel driving circuit array further includes a plurality of data lines; each of the plurality of data lines is electrically connected to a respective column of pixel driving circuits among a plurality of columns of pixel driving circuits arranged in the array; at least one heating line 50 is further included, and the heating line 50 is located between the base substrate 10 and the blocking layer 20, configured for controlling phase change of the phase change materials 40, and located at the same layer as the data line 90.

Specifically, the heating line 50 and the data line 90 are disposed at the same layer, so that the heating line 50 and the data line 90 can be manufactured and formed in the same manufacturing process by using the same mask plate instead of by using respective mask plates. Therefore, the number of mask plates used in the manufacturing method of the array substrate can be reduced, the process cost is reduced, the process steps are simplified, and the preparation efficiency is improved.

FIG. 19 exemplarily illustrates merely one thin film transistor of the pixel driving circuit 60, and it can be understood by those skilled in the art that the pixel driving circuit 60 includes not only one thin film transistor, but also a capacitor, or the like. Configuration in the following embodiment is also same as the configuration described above. Repetition will not be made here.

Optionally, the pixel driving circuit may include an active layer, a first insulating layer, a first metal layer, a second insulating layer and a second metal layer successively located on a side of the base substrate. The first metal layer may form a gate electrode in the pixel driving circuit, a scanning line, and a first electrode of a storage capacitor; the second metal layer may form a source electrode, a drain electrode, a data line and a power supply signal line in the pixel driving circuit. Materials of the first insulating layer and the second insulating layer may include an oxide of silicon or a nitride of silicon, which is not limited in the embodiment of the present disclosure. The pixel driving circuit may further include a third insulating layer and a third metal layer located between the first metal layer and the second insulating layer and stacked in a direction facing away from the base substrate. The third metal layer is generally used for forming a reference voltage line and a second electrode of the storage capacitor. The heating line may also be disposed at the same layer as the gate electrode; or the heating line is disposed at the same layer as the second electrode of the storage capacitor.

Figure 20:
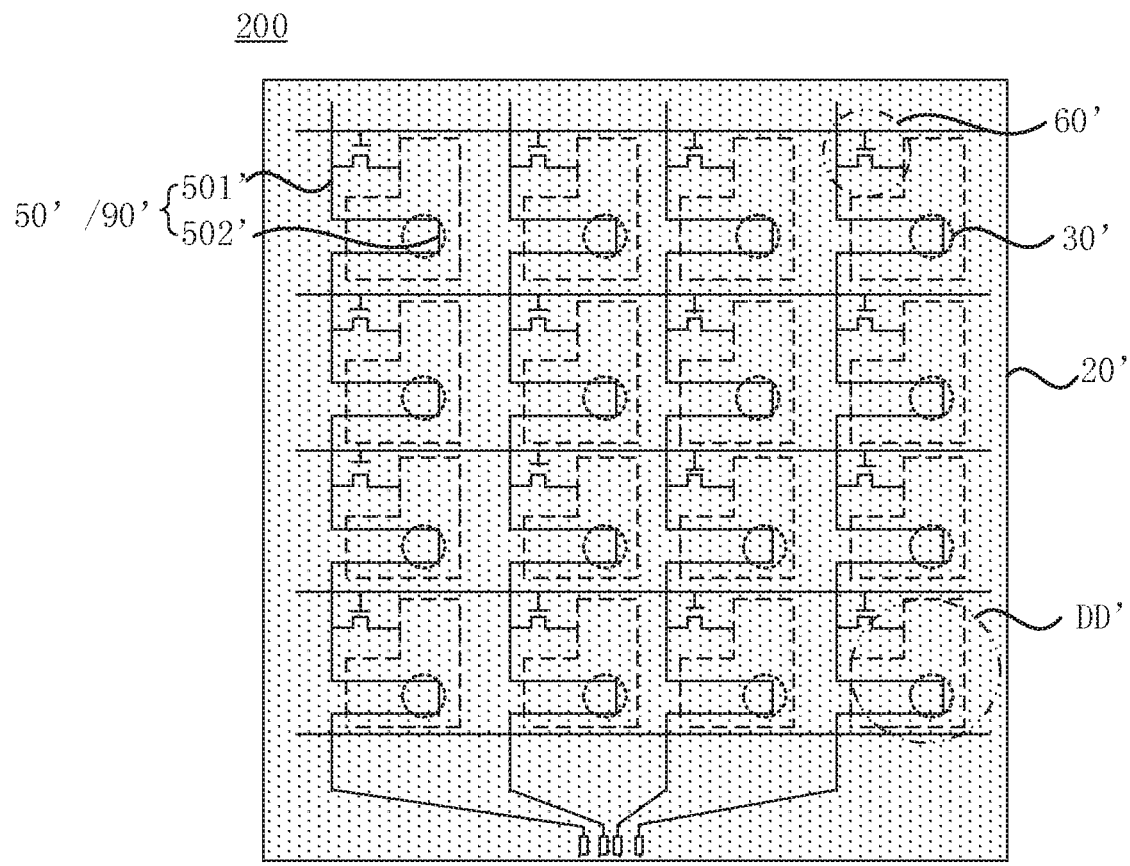
FIG. 20 is a schematic structural view of a display panel according to an embodiment of the present disclosure.
Figure 21:
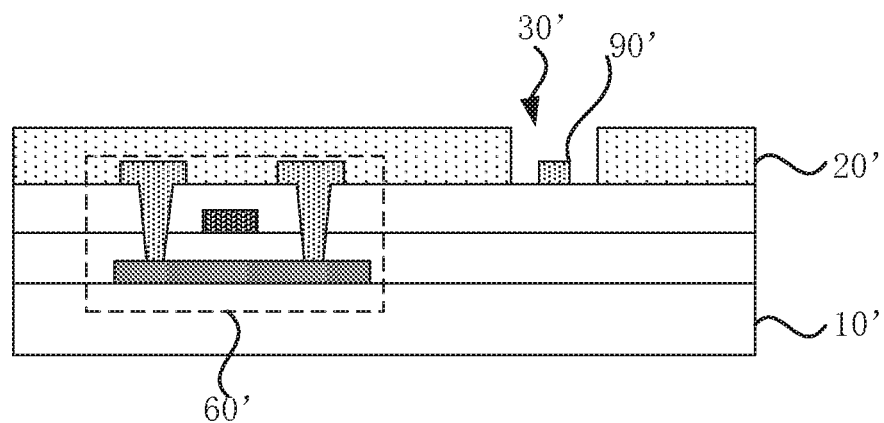
FIG. 21 is a schematic view of a film structure of a display panel according to an embodiment of the present disclosure.
Figure 22:
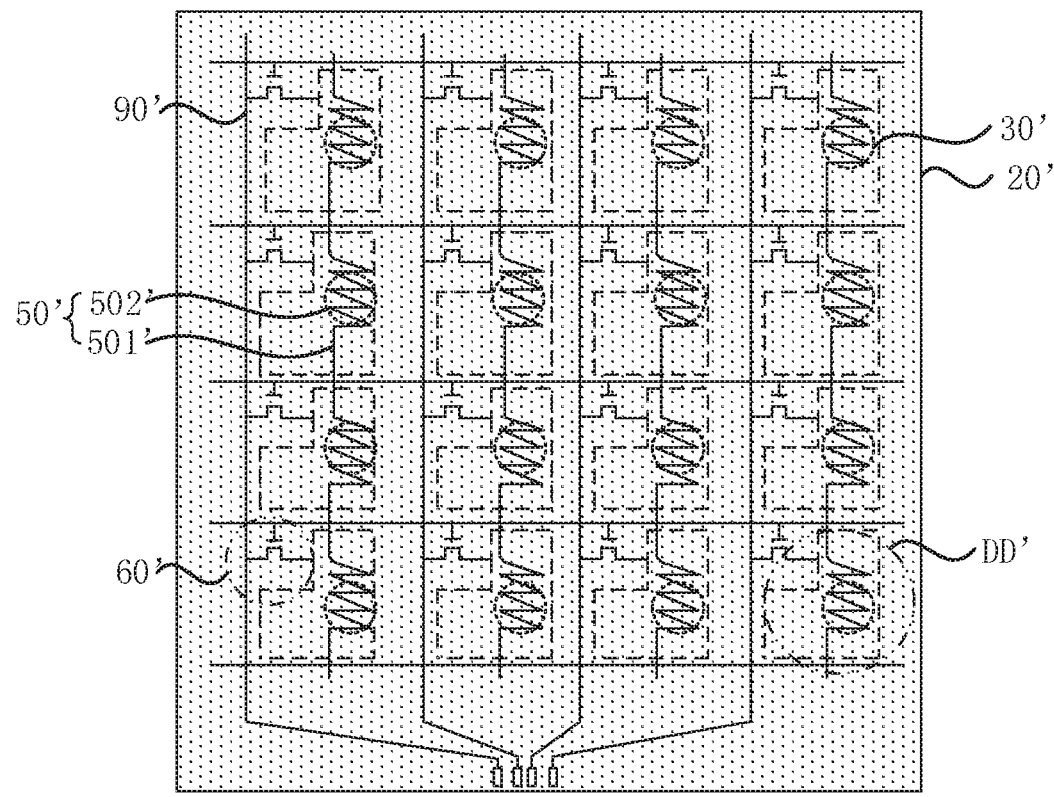
FIG. 22 is a schematic structural view of another display panel according to an embodiment of the present disclosure.
Figure 23:
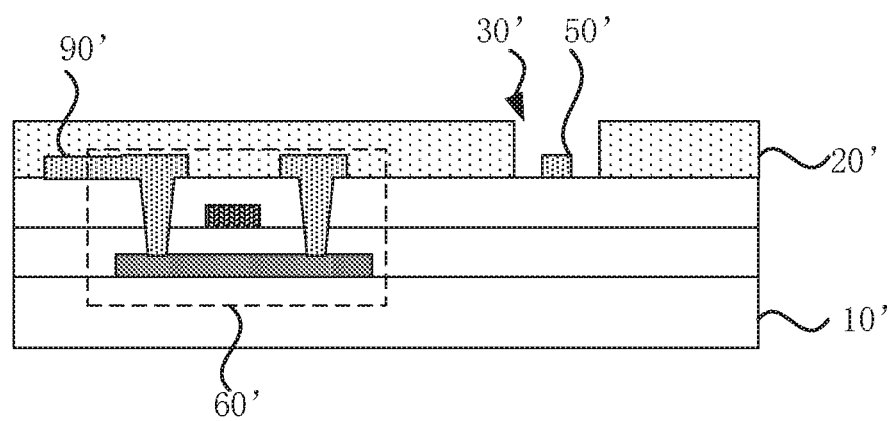
FIG. 23 is a schematic view of a film structure of another display panel according to an embodiment of the present disclosure.

Based on the same inventive concept, the embodiment of the present disclosure further provides a display panel. FIG. 20 is a schematic structural view of a display panel according to an embodiment of the present disclosure, FIG. 21 is a schematic view of a film structure of a display panel according to an embodiment of the present disclosure, FIG. 22 is a schematic structural view of a display panel according to an embodiment of the present disclosure, and FIG. 23 is a schematic view of a film structure of another display panel according to an embodiment of the present disclosure. As shown in FIGS. 20 and 21, a display panel 200 includes an array substrate, a pixel driving circuit array located on a side of a base substrate 10', and an insulating layer 20' located on a side of the pixel driving circuit array facing away from the base substrate, where the array substrate includes the base substrate 10', and the base substrate 10' includes sub-pixel setting regions DD' arranged in an array. The pixel driving circuit array includes pixel driving circuits 60' arranged in an array, the insulating layer 20' forms accommodating grooves 30' respectively within the sub-pixel setting regions DD', and the pixel driving circuits 60' are disposed in one-to-one correspondence with accommodating grooves 30'. The display panel further includes data lines and heating lines. Each data line 90' is electrically connected to a respective column of pixel driving circuits 60' among a plurality of columns of pixel driving circuits 60' arranged in the array. The data line 90' is multiplexed as the heating line. In a preparation stage, the data line 90' serves as the heating line to enable a light-emitting element to be transferred to the accommodating groove 30'; and in a display stage, the data line 90' is configured to provide a signal for the pixel driving circuit 60' so that the pixel driving circuit 60' is able to generate a current for driving the light-emitting element to emit light. Alternatively, as shown in FIGS. 20 and 21, the heating line 50' and the data line 90' are disposed at the same layer; in a phase change stage, the heating line 50' enables a light-emitting element to be transferred to the accommodating groove 30'; and in a display stage, the data line 90' is configured to provide a signal for the pixel driving circuit 60' so that the pixel driving circuit 60' is able to generate a current for driving the light-emitting element to emit light.

Specifically, in a preparation stage, the array substrate in the display panel 200 is multiplexed as the transfer substrate, and includes n types of light-emitting element setting regions DD' with different wavebands, and phase change materials are provided in accommodating grooves of object setting regions with at least (n−1) different wavebands. When corresponding light-emitting elements need to be provided in the accommodating grooves 30', phase change materials in the accommodating grooves 30' of light-emitting element setting regions DD' with the same waveband are simultaneously subjected to phase change while phase change materials in the accommodating grooves 30' of light-emitting element setting regions DD' with other wavebands are not subjected to phase change, so that transfer of light-emitting elements of a corresponding waveband is completed, and finally n types of light-emitting elements with different wavebands are all provided in the accommodating grooves 30' of the corresponding light-emitting element setting regions DD'. That is, the light-emitting elements, for example, Micro LEDs, can be directly provided on the array substrate through one transfer. Massive transfer of light-emitting elements is completed, the transfer steps are simplified and the transfer efficiency is further improved. In the display stage, since the light-emitting element has already been provided in the corresponding accommodating groove 30', a data signal can be provided for the driving circuit through the data line 90' to enable the pixel driving circuit 60' to generate a current for driving the light-emitting element to emit light.

Figure 24:
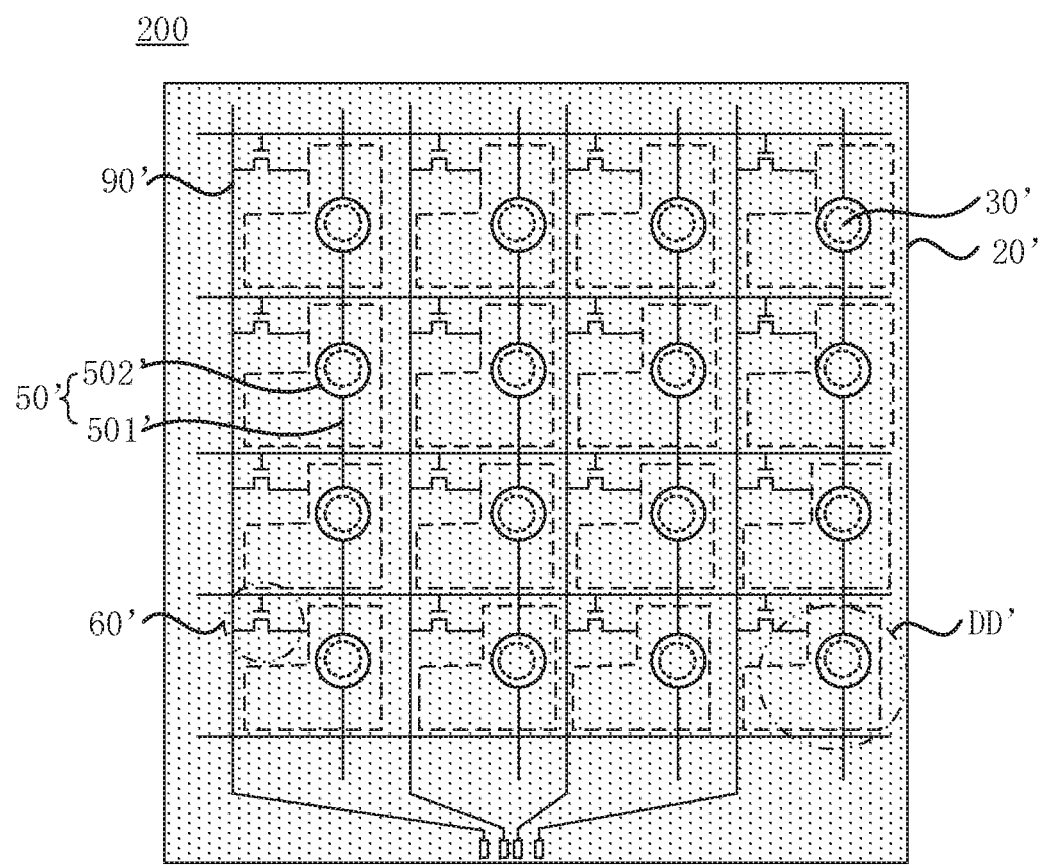
FIG. 24 is a schematic structural view of another display panel according to an embodiment of the present disclosure.

Optionally, the material of the insulating layer 20' may include, for example, an organic material. Optionally, the material of the insulating layer 20' may be, for example, photoresist. Since photoresist is a commonly used material in the display panel, it is not necessary to select a specific material individually, thus reducing the preparation cost of the display panel. Optionally, with continued reference to FIG. 20, a heating line 50' includes a first portion 501' and a second portion 502'; a vertical projection of the second portion 502' on a plane where the base substrate 10' is located at least partially overlaps a vertical projection of the accommodating groove 30' on the plane where the base substrate 10' is located. Alternatively, FIG. 24 is a schematic structural view of another display panel according to an embodiment of the present disclosure, and as shown in FIG. 24, at least part of a vertical projection of the second portion 502' on a plane where the base substrate 10' is located surrounds a vertical projection of the accommodating groove 30' on the plane where the base substrate 10' is located.

Specifically, in the phase change stage, since the heating line 50' provides the phase change temperature for the phase change material, the second portion 502' is disposed at a position of the accommodating groove 30', i.e., directly above or directly below the phase change material or around the phase change material in the embodiment, so that the phase change speed of the phase change material is ensured and the transfer speed is further improved.

It should be noted that by way of example, the data line 90' is reused as the heating line 50' in FIG. 20, and the data line 90' and the heating line 50' are separately provided in FIG. 22, but such configuration does not constitute a limitation to the present disclosure, and those skilled in the art can set the data line 90' and the heating line 50' according to the actual situation. Optionally, a direct current voltage can be applied to the heating line so that the heating line can provide a phase change temperature. Since the current in the same heating line is the same, the heating power can be provided through an increase in the resistance of the second portion of the heating line, thus improving the phase change speed of the phase change material.

Figure 25:
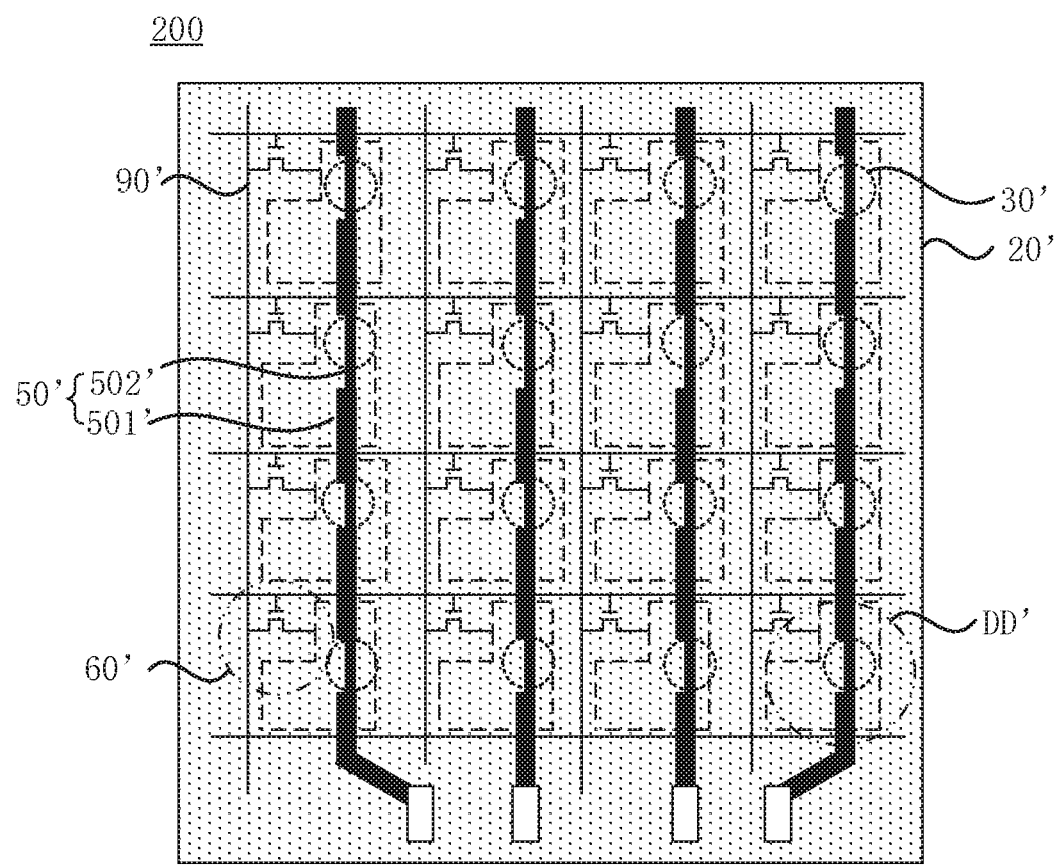
FIG. 25 is a schematic view of another display panel according to an embodiment of the present disclosure.

Optionally, FIG. 25 is a schematic structural view of another display panel according to an embodiment of the present disclosure, and as shown in FIG. 25, a resistance per unit length of the second portion 502' is greater than a resistance per unit length of the first portion 501'.

Specifically, it can be seen from $R=(\rho L)/S$ that the area of the cross-section of the second portion 502' on the plane perpendicular to the column direction can be set to be smaller than the area of the cross-section of the first portion 501' on the plane perpendicular to the column direction so that the resistance per unit length of the second portion 502' is greater than the resistance per unit length of the first portion 501'.

Optionally, with continued reference to FIG. 22, a shape of the vertical projection of the second portion 502' on the plane where the base substrate 10' is located has at least one of a straight line, a broken line, or a curved line.

Specifically, it can be seen from $R=(\rho L)/S$ that the length of the second portion 502' can be increased so that the resistance of the second portion 502' is greater than the resistance of the first portion 501'.

Figure 26:
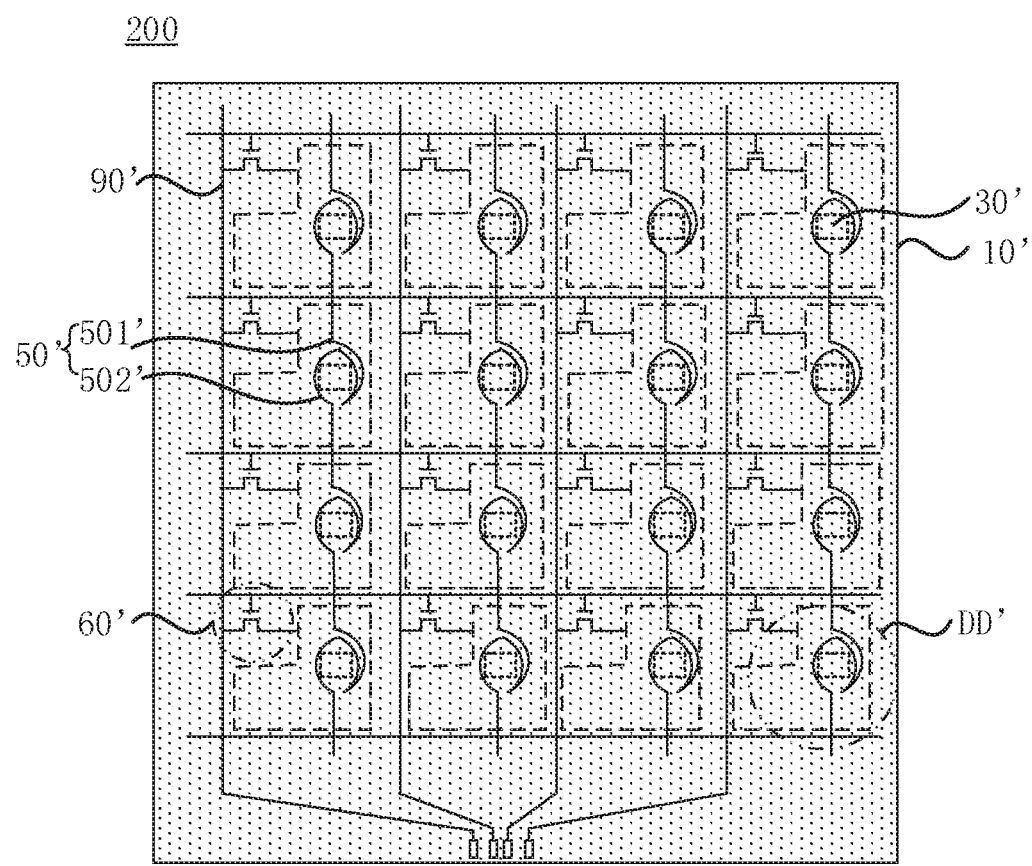
FIG. 26 is a schematic structural view of another display panel according to an embodiment of the present disclosure.

It should be noted that the embodiment does not specifically limit the shape of the second portion 502', as long as the length of the second portion 502' can be increased. By way of example, the vertical projection of the second portion 502' on the plane where the base substrate 10' is located has a shape of a broken line in FIG. 22. In other optional embodiments, the shape of the vertical projection may also be spiral, for example, continued reference is made to FIG. 24 or 26.

Figure 27:
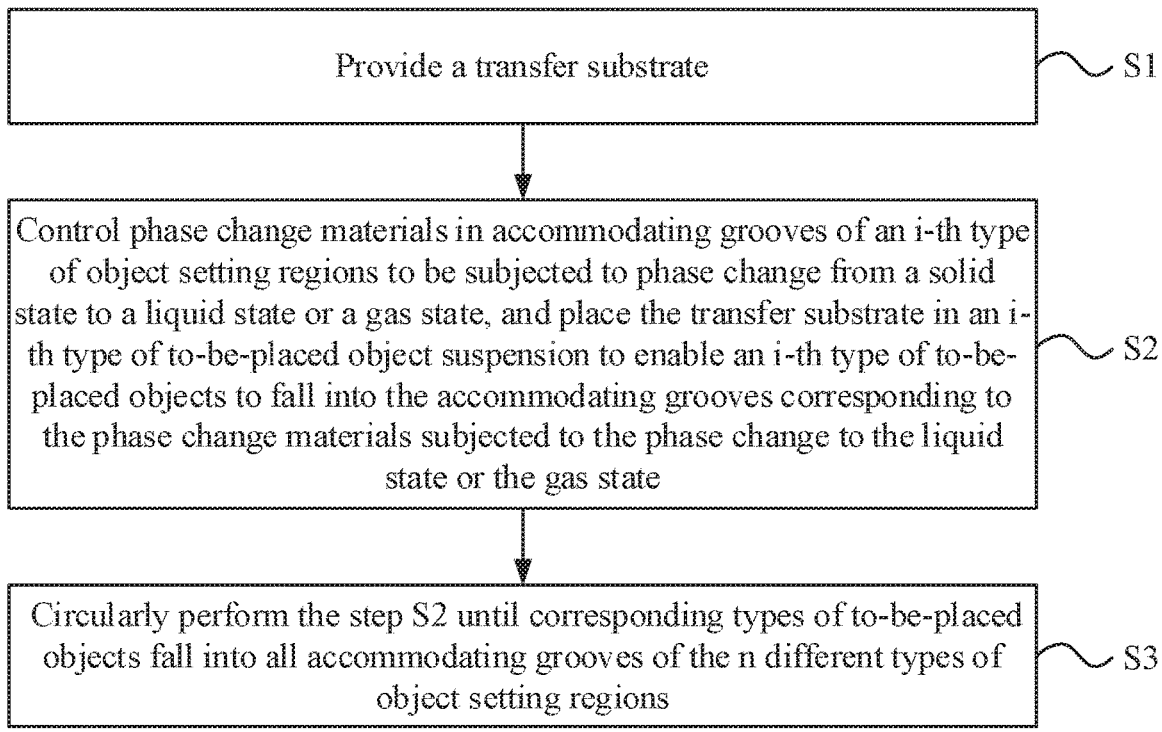
FIG. 27 is a flowchart of a transfer method according to an embodiment of the present disclosure.

Based on the same inventive concept, the embodiment of the present disclosure further provides a transfer method. FIG. 27 is a flowchart of a transfer method according to an embodiment of the present disclosure. As shown in FIG. 27, the method includes steps described below.

In S1, a transfer substrate is provided. The transfer substrate includes a plurality of object setting regions which are arranged in an array and configured to place objects to be placed, the plurality of object setting regions including n types, where n is a positive integer, and n≥2. The transfer substrate further includes: a base substrate, and a blocking layer located on a side of the base substrate, where the blocking layer forms accommodating grooves respectively within object setting regions. Phase change materials are provided in accommodating grooves of at least (n−1) types of object setting regions.

Phase change materials may be provided in accommodating grooves of (n−1) types of object setting regions. Phase change materials may also be provided in accommodating grooves of all the n types of object setting regions. The phase change materials may be the same, i.e. the phase change temperatures being the same, and may be different, but phase change materials in the accommodating grooves of a same type of object setting regions need to be ensured to be the same.

In S2, phase change materials in accommodating grooves of an i-th type of object setting regions are controlled to be subjected to phase change from a solid state to a liquid state or a gas state, and the transfer substrate is placed in an i-th type of to-be-placed object suspension to enable an i-th third type of to-be-placed objects to fall into the accommodating grooves corresponding to the phase change materials subjected to the phase change to the liquid state or the gas state.

When phase change materials are provided in accommodating grooves of (n−1) types of object setting regions, the transfer substrate is directly placed in the to-be-placed object suspension having the same type as the regions where no phase change material is placed. The to-be-placed objects are placed in the liquid so that the damage to the to-be-placed objects caused by factors such as friction is avoided. Then, the to-be-placed objects can quickly fall, by means of, for example, oscillation, into all the accommodating grooves where no phase change material is provided. Thus, transfer of one third type of to-be-placed objects is completed. Then, the phase change materials in the accommodating grooves of the second type of to-be-placed objects are subjected to phase change from a solid state to a liquid state or a gas state.

At this time, according to the above method, the second type of to-be-placed object is also enabled to fall into the plurality of accommodating grooves where the phase change occurs to finish the transfer of the second type of to-be-placed objects.

When phase change materials are provided in all accommodating grooves of the n types of object setting regions, the phase change materials in the accommodating grooves of one type of object setting regions are controlled to be subjected to phase change from a solid state to a liquid state or a gas state, and the transfer substrate is placed in the to-be-placed object suspension having the same type as the one type so that the to-be-placed objects fall into the accommodating grooves corresponding to the phase change materials subjected to the phase change to the liquid state or the gas state.

It should be noted that the to-be-placed object falling into the accommodating groove is not limited to placing the transfer substrate in the i-th type of to-be-placed object suspension and performing oscillation, and a method may be used as long as the to-be-placed object can fall into the accommodating groove.

It can be understood that when the phase change material is subjected to phase change, it is necessary to ensure that the suspension is not a solid or a gas at the temperature during the whole working process.

In S3, the step S2 is circularly performed until corresponding types of to-be-placed objects fall into all accommodating grooves of the n different types of object setting regions, where i is a positive integer less than or equal to n.

In this way, the massive transfer of different types of to-be-placed objects can be quickly achieved, the transfer period is shortened, and the transfer efficiency is improved.

According to the transfer method provided in the embodiment of the present disclosure, phase change materials are provided in the accommodating grooves of object setting regions, so that when no to-be-placed object needs to be transferred, the phase change materials are provided in the accommodating grooves of the object setting regions, and when the to-be-placed objects need to be transferred, the phase change materials in all the accommodating grooves of one type of object setting regions are subjected to phase change. At this time, a plurality of to-be-placed objects corresponding to the one type of object setting regions can be provided at one time in the plurality of accommodating grooves in which phase change occurs, and other accommodating grooves cannot be provided with to-be-placed objects due to the fact that phase change materials are provided in these other accommodating grooves. In this way, transfer of one third type of to-be-placed objects at one time is achieved, and finally all n types of to-be-placed objects are placed in the corresponding accommodating grooves. Through the transfer substrate of the embodiment, massive transfer of different types of to-be-placed objects can be quickly achieved, the transfer period is shortened, and the transfer efficiency is improved.

Optionally, when phase change materials in all the accommodating grooves are the same and the solid-liquid phase change temperature is, for example, X° C., the transfer substrate is first heated to above X° C., and the phase change materials are provided at all the accommodating grooves. Then, the transfer substrate is cooled to below X° C., and the phase change materials are solid, thereby completing the setting of the phase change materials. At this time, if to-be-placed objects are desired to fall into the accommodating grooves, the to-be-placed objects fail to be provided in the accommodating grooves since phase change materials occupy the positions of the accommodating grooves. When phase change materials in the accommodating grooves of one type of object setting regions need to be subjected to phase change to a liquid state or a gas state, merely the phase change materials in the accommodating grooves of the one type of object setting regions are heated, and other object setting regions are not heated. In this way, the to-be-placed objects can then fall into the accommodating grooves corresponding to the phase materials from the solid state to the liquid state or the gas state.

Optionally, when phase change temperatures of phase change materials in the accommodating grooves of different types of object setting regions are different, for example, a first phase change material and a second phase change material are included, the solid-liquid phase change temperature of the first phase change material is X° C., the solid-liquid phase change temperature of the second phase change material is Y° C., and X is greater than Y, the transfer substrate is set in an environment of Z° C., where X is greater than Y and Y is greater than Z. First phase change materials are dripped into the accommodating grooves of the first type of object setting regions, and since the temperature at the moment is lower than the first phase change temperature, the first phase change materials are in a solid state. Then, second phase change materials are dripped into the accommodating grooves of the second type of object setting regions, and since the temperature at the moment is lower than the second phase change temperature, the second phase change materials are in a solid state. Thus, the setting of the phase change material is completed.

Optionally, when phase change temperatures of phase change materials in the accommodating grooves of different types of object setting regions are different, for example, a first phase change material and a second phase change material are included, the solid-liquid phase change temperature of the first phase change material is X° C., the solid-liquid phase change temperature of the second phase change material is Y° C., and X is greater than Y, the transfer substrate is set in an environment of Z° C., where X is greater than Y and Y is greater than Z. The second phase change materials are first set in the environment of Z° C., and thus the second phase change materials are solidified. At this time, the solidified second phase change materials are not only provided in the accommodating grooves of the type of object setting regions corresponding to the solidified second phase change materials, but also provided in the accommodating grooves of the type of object setting regions not corresponding to the solidified second phase change materials, that is, but also provided in the accommodating grooves of the type of object setting regions corresponding to the first phase change materials. At this time, positions of the accommodating grooves of the type of object setting regions corresponding to the first phase change materials are heated, so that the second phase change materials are not solidified in the accommodating grooves of the type of object setting regions corresponding to the first phase change materials. Therefore, the setting of the second phase change materials can be completed. Then, the first phase change materials are provided in the environment of Z° C. Since the solid second phase change materials have been provided in the remaining accommodating grooves, the first phase change materials are merely provided in the accommodating grooves of the type of object setting regions corresponding to the first phase change materials, thus completing the setting of the first phase change materials and the second phase change materials.

Optionally, different phase change materials can be provided in the accommodating grooves of the corresponding object setting regions in a printing manner. Optionally, different phase change materials can be provided in the accommodating grooves of the corresponding object setting regions in a manner of 3D printing.

It can be understood that the above solution merely exemplarily illustrates the manner in which the phase change material is provided in the accommodating groove, but such manner does not constitute a limitation to the present disclosure, and a method may be used as long as the phase change material can be provided in the accommodating groove.

On the basis of the above solution, optionally, the phase change temperatures of the phase change materials provided in the accommodating grooves of different types of object setting regions are different.

The step of controlling the phase change materials in the accommodating grooves of the i-th type of object setting regions to be subjected to the phase change from the solid state to the liquid state or the gas state, and placing the transfer substrate in the i-th type of to-be-placed object suspension to enable the i-th third type of to-be-placed objects to fall into the accommodating grooves corresponding to the phase change materials subjected to the phase change to the liquid state or the gas state includes a step described below.

At least one of a temperature of the base substrate, an ambient temperature of the transfer substrate or a temperature of a to-be-placed object suspension is controlled to enable the phase change materials in the accommodating grooves of the i-th type of object setting regions to be subjected to the phase change from the solid state to the liquid state or the gas state, and the transfer substrate is placed in the i-th type of to-be-placed object suspension to enable the i-th third type of to-be-placed objects to fall into the accommodating grooves corresponding to the phase change materials subjected to the phase change to the liquid state or the gas state.

It should be noted that the embodiment does not limit how to control the phase change of the phase change material, and a method may be used as long as the i-th third type of to-be-placed objects can fall into the accommodating grooves corresponding to the phase change materials subjected to phase change.

Figure 28:
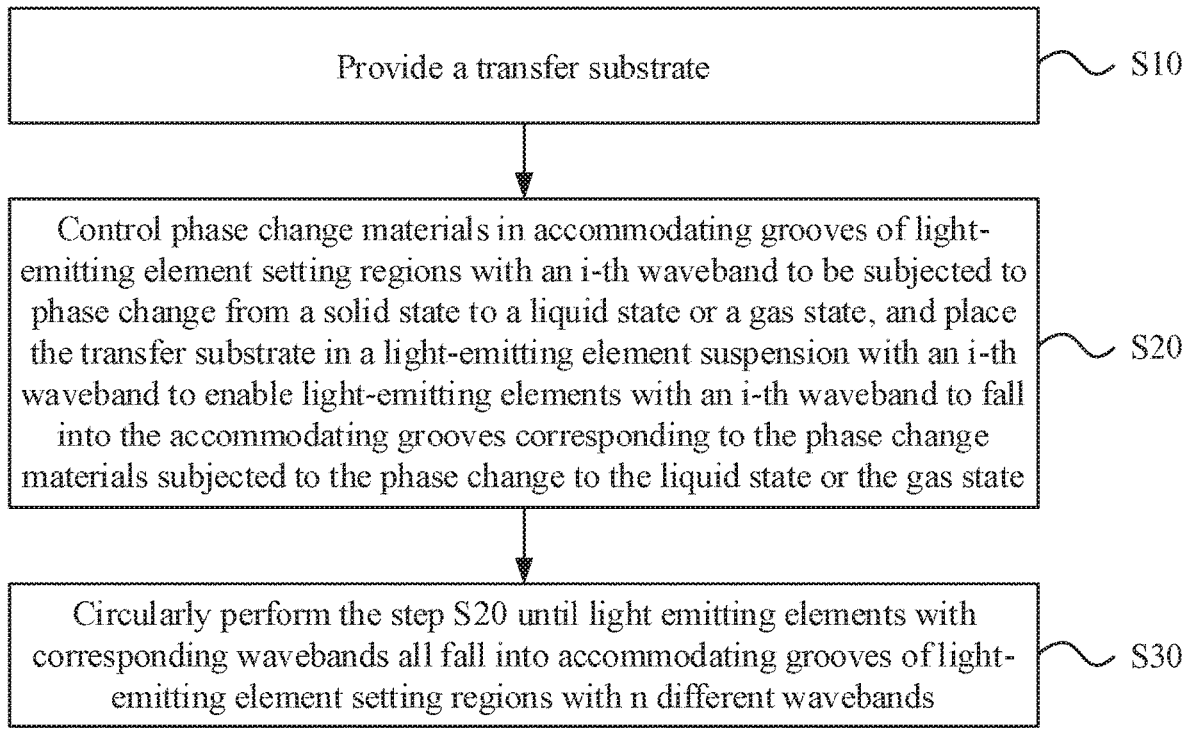
FIG. 28 is a flowchart of another transfer method according to an embodiment of the present disclosure.

Optionally, FIG. 28 is a flowchart of another transfer method according to an embodiment of the present disclosure. As shown in FIG. 28, the method includes steps described below.

In S10, a transfer substrate is provided. The transfer substrate includes a plurality of light-emitting element setting regions with different wavebands arranged in an array, the plurality of light-emitting element setting regions with different wavebands including n types, where n is a positive integer, and n≥2. The transfer substrate further includes: a base substrate, and a blocking layer located on a side of the base substrate, where the blocking layer forms accommodating grooves respectively within the object setting regions. Phase change materials are provided in accommodating grooves of at least (n−1) types of light-emitting element setting regions.

n types of light-emitting element setting regions with different wavebands are used for transferring light-emitting elements with n wavebands. The light-emitting element may include, for example, a Micro LED or a Mini LED. That is, a massive number of light-emitting elements are transferred.

Phase change materials may be provided in accommodating grooves of (n−1) types of light-emitting element setting regions. Phase change materials may also be provided in accommodating grooves of n types of light-emitting element setting regions. The phase change materials may be the same, i.e. the phase change temperatures being the same, and may be different, but phase change materials in the accommodating grooves of a same type of light-emitting element setting regions need to be ensured to be the same.

In S20, phase change materials in accommodating grooves of i-th-waveband light-emitting element setting regions are controlled to be subjected to phase change from a solid state to a liquid state or a gas state, and the transfer substrate is placed in i-th-waveband light-emitting element suspension to enable light-emitting elements with an i-th waveband to fall into the accommodating grooves corresponding to the phase change materials subjected to the phase change to the liquid state or the gas state.

When phase change materials are provided in accommodating grooves of (n−1) types of light-emitting element setting regions, the transfer substrate is directly placed in the light-emitting element suspension having the same type as the regions where no phase change material is placed. The light-emitting elements are placed in the liquid so that the damage to the light-emitting elements caused by factors such as friction is avoided. Then, the light-emitting elements can quickly fall, by means of, for example, oscillation or the like, into all the accommodating grooves where no phase change material is provided. Thus, transfer of one type of light-emitting element is completed. Then, the phase change materials in the accommodating grooves of the second type of light-emitting element are subjected to phase change from a solid state to a liquid state or a gas state. At this time, according to the above method, the second type of light-emitting element is also enabled to fall into the plurality of accommodating grooves where the phase change occurs to finish the transfer of the second type of light-emitting element.

When phase change materials are provided in accommodating grooves of all the n types of light-emitting element setting regions, the phase change materials in the accommodating grooves of one type of light-emitting element setting region are controlled to be subjected to phase change from a solid state to a liquid state or a gas state, and the transfer substrate is placed in the light-emitting element suspension having the same type as the one type so that the light-emitting elements fall into the accommodating grooves corresponding to the phase change materials in the liquid state or the gas state due to phase change.

It should be noted that the light-emitting element falling into the accommodating groove is not limited to placing the transfer substrate in the i-th type of light-emitting element suspension and performing oscillation, and a method may be used as long as the light-emitting element can fall into the accommodating groove.

In S30, the step S20 is circularly performed until light-emitting elements with corresponding wavebands fall into all accommodating grooves of n types of light-emitting element setting regions with different wavebands.

In this way, the massive transfer of different types of light-emitting elements can be quickly achieved, the transfer period is shortened, and the transfer efficiency is improved.

On the basis of the above solution, optionally, after the light-emitting elements with corresponding wavebands fall into all the accommodating grooves of the different-waveband light-emitting element setting regions, the method further includes a step described below.

All light-emitting elements on the transfer substrate are transferred to an array substrate, where the array substrate includes a pixel driving circuit array.

The pixel driving circuit array includes pixel driving circuits arranged in an array; and the pixel driving circuits are in one-to-one correspondence with the light-emitting elements.

Specifically, since the positions of the light-emitting elements with different wavebands on the transfer substrate correspond to the positions on the array substrate where the light-emitting elements need to be disposed, and the required light-emitting elements on the array substrate correspond to the light-emitting elements on the transfer substrate, the light-emitting elements with different wavebands can be transferred to preset positions on the array substrate at one time through the transfer substrate, and finally the massive transfer of light-emitting elements can be achieved, and the transfer efficiency is high.

It is to be noted that the above are merely preferred embodiments of the present disclosure and the technical principles used therein. It is to be understood by those skilled in the art that the present disclosure is not limited to the specific embodiments described herein. Those skilled in the art can make various apparent modifications, adaptations and substitutions without departing from the scope of the present disclosure. Therefore, while the present disclosure has been described in detail through the above-mentioned embodiments, the present disclosure is not limited to the above-mentioned embodiments and may further include more other equivalent embodiments without departing from the concept of the present disclosure. The scope of the present disclosure is determined by the scope of the appended claims.

What is claimed is:

1. A transfer substrate, comprising a plurality of object setting regions which are arranged in an array and configured to place objects to be placed, the plurality of object setting regions comprising n types, wherein n is a positive integer, and n≥2;
    wherein the transfer substrate further comprises:
    a base substrate;
    a blocking layer located on a side of the base substrate, wherein the blocking layer forms accommodating grooves respectively within the plurality of object setting regions; and
    phase change materials provided in accommodating grooves of at least (n−1) types of object setting regions.

2. The transfer substrate of claim 1, wherein the plurality of object setting regions comprises n types of light-emitting element setting regions with different wavebands.

3. The transfer substrate of claim 1, wherein in response to n≥3, phase change temperatures of phase change materials provided in accommodating grooves of different types of object setting regions are different.

4. The transfer substrate of claim 1, wherein no phase change material is provided in accommodating grooves of a j-th type of object setting regions;
    wherein j is a positive integer less than or equal to n.

5. The transfer substrate of claim 1, wherein phase change materials are provided in accommodating grooves of all of the n types of object setting regions; and
    phase change temperatures of the phase change materials in all the accommodating grooves are same.

6. The transfer substrate of claim 1, further comprising at least one heating line, wherein the at least one heating line is configured to control phase change of the phase change materials.

7. The transfer substrate of claim 6, wherein phase change of phase change materials provided in accommodating grooves of a same type of object setting regions is controlled by a same one of the at least one heating line.

8. The transfer substrate of claim 6, wherein phase change of phase change materials provided in accommodating grooves of a same type of object setting regions, located in a same column or a same row, of the plurality of object setting regions arranged in the array is controlled by a same one of the at least one heating line.

9. The transfer substrate of claim 6, wherein each of the at least one heating line comprises a first portion and a second portion; and
    a vertical projection of the second portion on a plane where the base substrate is located at least partially overlaps a vertical projection of an accommodating groove on the plane where the base substrate is located; or
    at least part of a vertical projection of the second portion on a plane where the base substrate is located surrounds a vertical projection of an accommodating groove on the plane where the base substrate is located.

10. The transfer substrate of claim 9, wherein a resistance per unit length of the second portion is greater than a resistance per unit length of the first portion.

11. The transfer substrate of claim 9, wherein a shape of the vertical projection of the second portion on the plane where the base substrate is located comprises at least one of a straight line, a broken line, or a curved line.

12. The transfer substrate of claim 2, further comprising a pixel driving circuit array which is located between the blocking layer and the base substrate;
    wherein the pixel driving circuit array comprises pixel driving circuits arranged in an array; and the pixel driving circuits are in one-to-one correspondence with accommodating grooves.

13. The transfer substrate of claim 12, wherein the pixel driving circuit array further comprises a plurality of data lines; each of the plurality of data lines is electrically connected to a respective column of pixel driving circuits among a plurality of columns of pixel driving circuits arranged in the array; and the plurality of data lines is multiplexed as heating lines.

14. The transfer substrate of claim 13, further comprising n first heating power supply terminals and n second heating power supply terminals; one end of a heating line corresponding to phase change materials provided in accommodating grooves of a same type of object setting regions is connected to a same first heating power supply terminal, and the other end of the heating line corresponding to the phase change materials provided in the accommodating grooves of the same type of object setting regions is connected to a same second heating power supply terminal.

15. The transfer substrate of claim 12, wherein the pixel driving circuit array further comprises a plurality of data lines; each of the plurality of data lines is electrically connected to a respective column of pixel driving circuits among a plurality of columns of pixel driving circuits arranged in the array;
    the pixel driving circuit array further comprises at least one heating line; the at least one heating line is located between the base substrate and the blocking layer; and the at least one heating line is configured to control phase change of the phase change materials; and
    the at least one heating line is located at a same layer as the plurality of data lines.

16. The transfer substrate of claim 1, wherein the phase change materials comprise one of water, disodium hydrogen phosphate dodecahydrate, lauric acid, or calcium chloride hexahydrate.

* * * * *